(12) United States Patent
Ito et al.

(10) Patent No.: US 8,476,550 B2
(45) Date of Patent: Jul. 2, 2013

(54) MANUFACTURING METHOD OF HERMETICALLY SEALED CONTAINER

(75) Inventors: Nobuhiro Ito, Yamato (JP); Akihiro Kimura, Kawasaki (JP); Tomonori Nakazawa, Atsugi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/191,694

(22) Filed: Jul. 27, 2011

(65) Prior Publication Data

US 2012/0048453 A1  Mar. 1, 2012

(30) Foreign Application Priority Data

Aug. 25, 2010 (JP) ................. 2010-188430

(51) Int. Cl.
*C03C 27/06* (2006.01)
*H01J 29/86* (2006.01)
*H05B 33/04* (2006.01)
*B23K 26/20* (2006.01)

(52) U.S. Cl.
USPC ............ 219/121.64; 65/59.1; 156/272.8; 219/121.66; 445/25

(58) Field of Classification Search
USPC ........... 219/121.63, 121.64, 121.65, 121.66, 219/85.12, 85.13; 65/36, 40, 59.1; 156/272.8, 156/274.4, 274.6, 274.8; 228/122.1, 124.6; 445/25

See application file for complete search history.

(56) References Cited

U.S. PATENT DOCUMENTS

| | | | |
|---|---|---|---|
| 4,294,602 A * | 10/1981 | Horne | 65/40 |
| 2006/0084348 A1 | 4/2006 | Becken et al. | |
| 2009/0000731 A1 * | 1/2009 | Hasegawa et al. | 156/272.8 |
| 2009/0044496 A1 | 2/2009 | Botelho et al. | |
| 2009/0088041 A1 * | 4/2009 | Inoue et al. | 445/73 |
| 2009/0109595 A1 * | 4/2009 | Herchen et al. | 361/234 |
| 2009/0277887 A1 * | 11/2009 | Kurachi | 219/121.64 |
| 2011/0253684 A1 * | 10/2011 | Jaspers | 219/121.64 |

FOREIGN PATENT DOCUMENTS

JP  2009-009957 A  *  5/2009

OTHER PUBLICATIONS

K. Kamoshida, "Argon entrapment in magnetron-sputtered Al alloy films", Thin Solid Films, Sep. 1, 1996, pp. 57-60, vol. 283, No. 1.

* cited by examiner

*Primary Examiner* — Geoffrey S Evans
(74) *Attorney, Agent, or Firm* — Fitzpatrick, Cella, Harper & Scinto

(57) ABSTRACT

A manufacturing method of a hermetic container includes steps of bonding a frame member to a first substrate, by pressing the first substrate and the second substrate to each other by an electrostatic force generated between a first electrode and a second electrode by applying a potential difference between the first electrode and the second electrode, and softening and melting the bonding material. Additional steps include cooling and solidifying the bonding material by simultaneously heating the bonding material with a local heating unit and moving the local heating unit, and increasing the potential difference between the first electrode and a segment of the second electrode, which is in a position at which the segment is heated by the local heating unit.

21 Claims, 20 Drawing Sheets

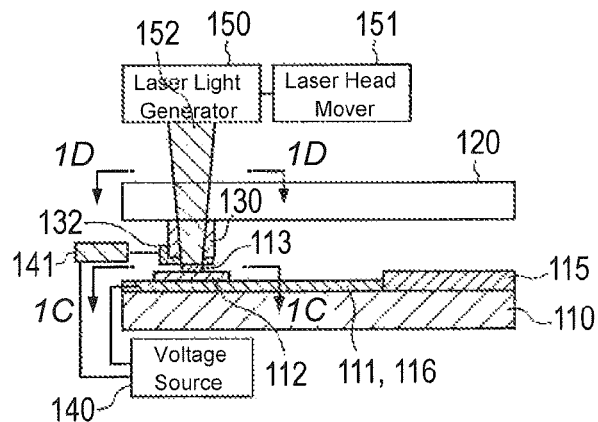
FIG. 1A
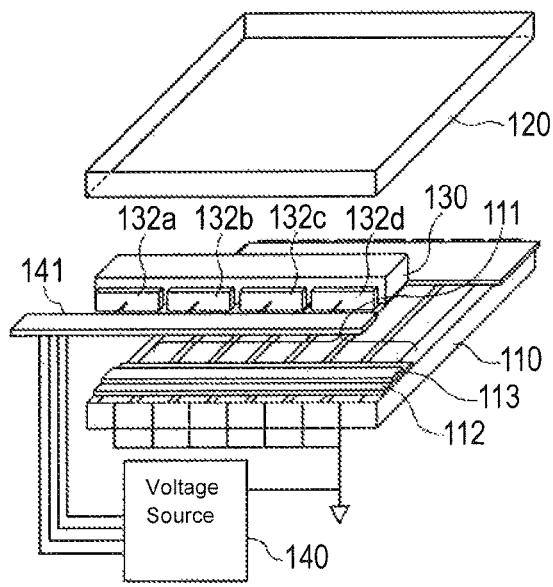
FIG. 1B
FIG. 1C
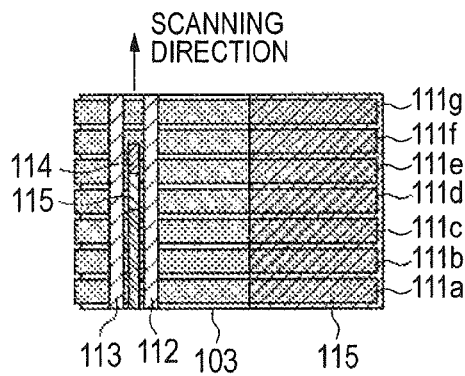
FIG. 1D

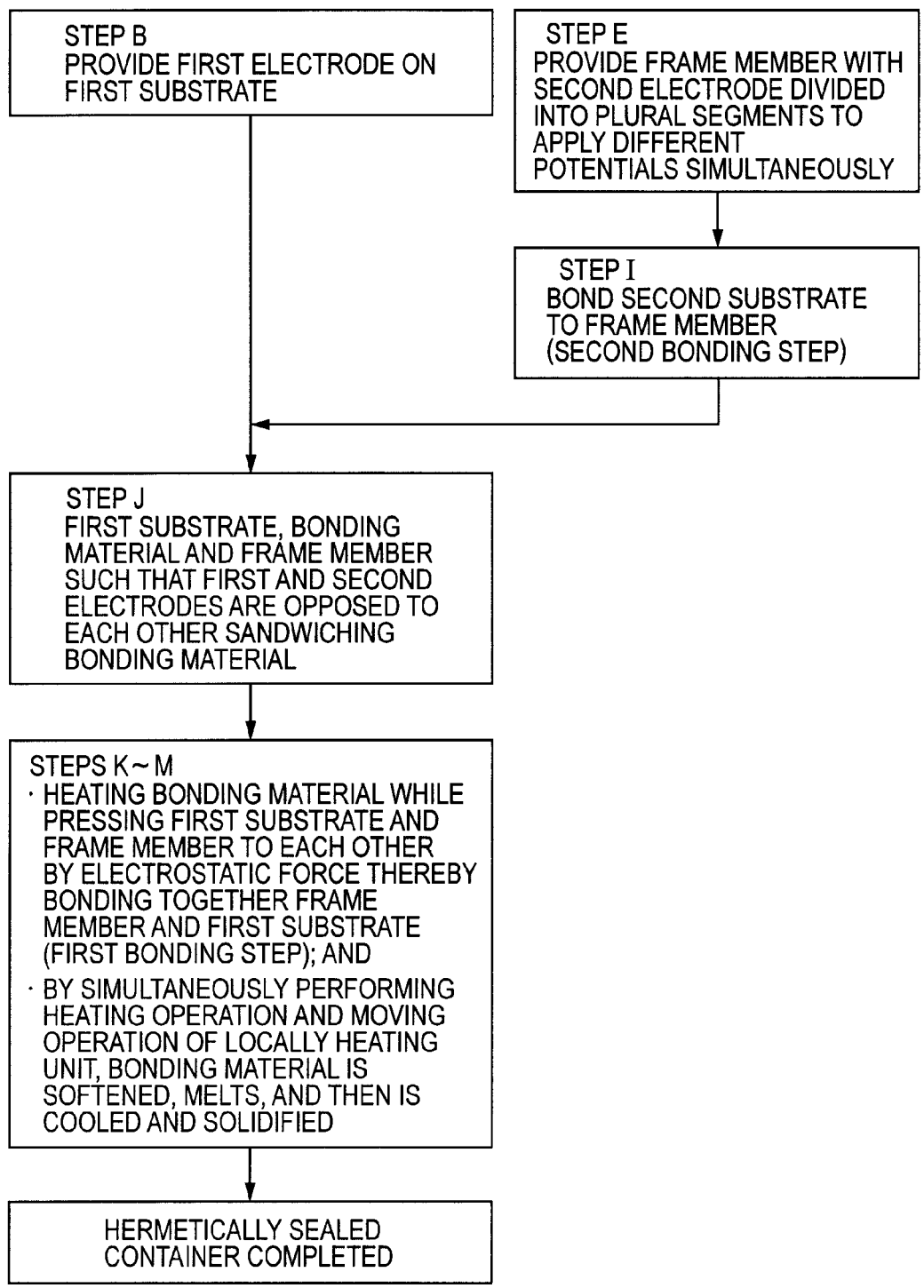

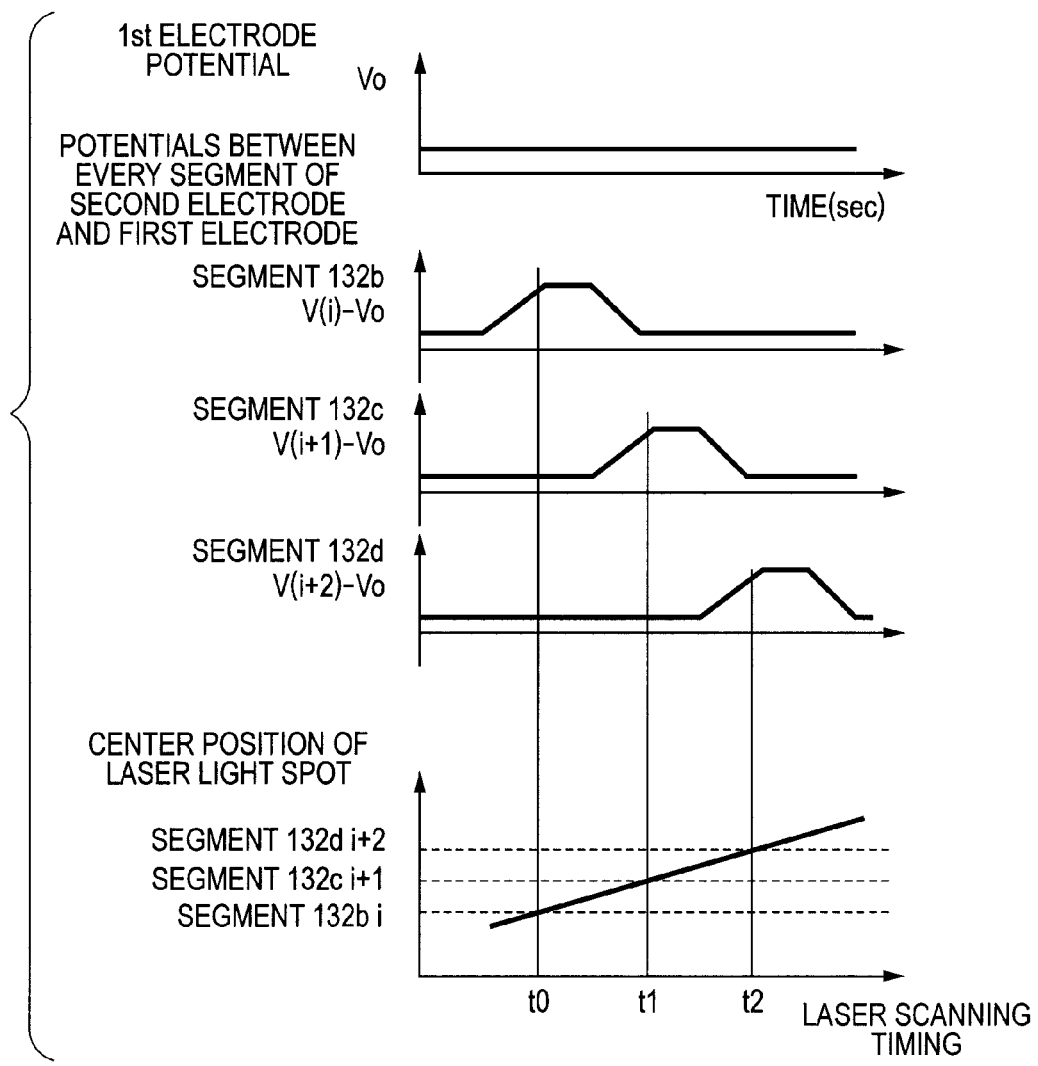

FIG. 8A
FIG. 8B
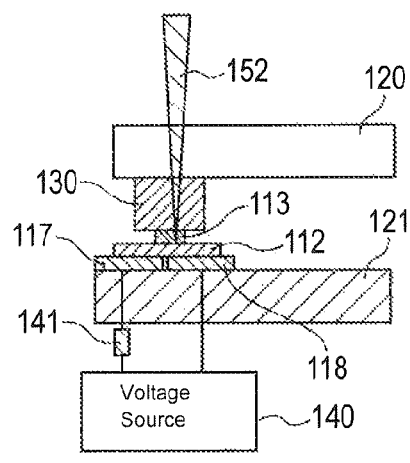
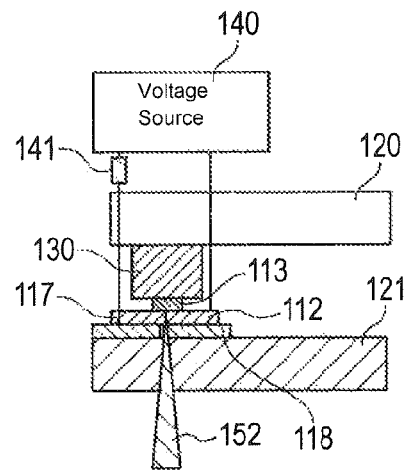
FIG. 8C
FIG. 8D
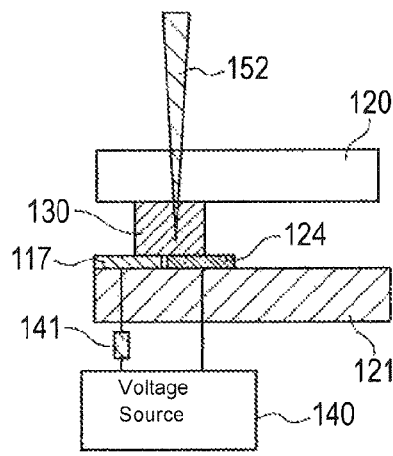
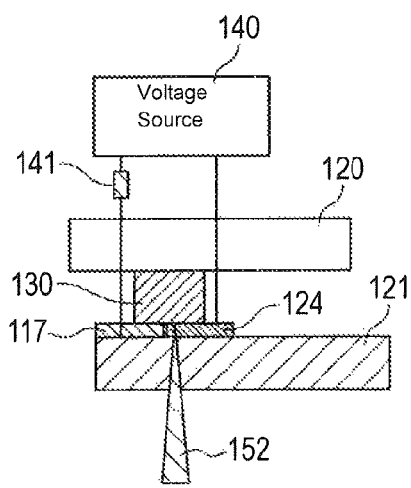

NECESSARY VOLTAGE FOR PRESSING $$Vst = d\sqrt{2\frac{Pst}{\varepsilon}} \quad (1)$$

ELECTROSTATIC PRESSING FORCE $$Pst = \frac{\varepsilon}{2}\left(\frac{Vst}{d}\right)^2 \quad (2)$$

EQUIPOTENTIAL LINE

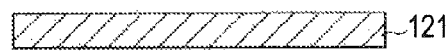
FIG. 16A
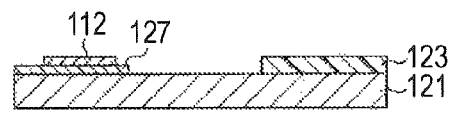
FIG. 16B
FIG. 16C
FIG. 16D  FIG. 16E
 
FIG. 16F
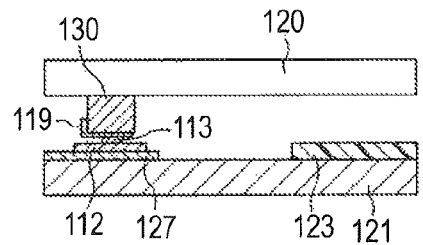
FIG. 16G
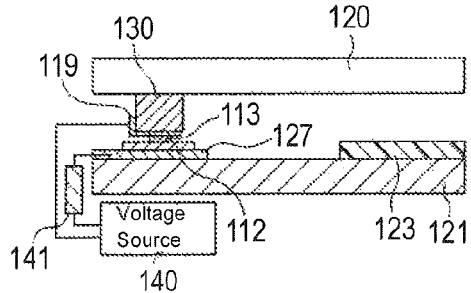
FIG. 16H
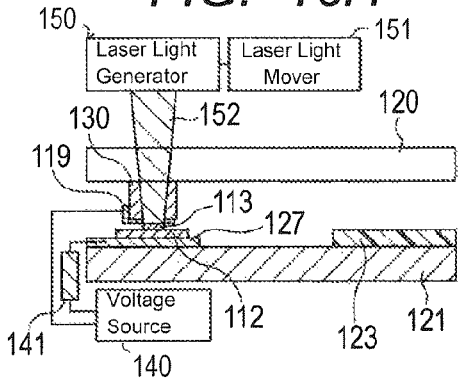
FIG. 16I
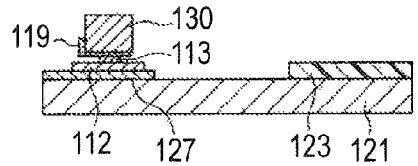
FIG. 16J
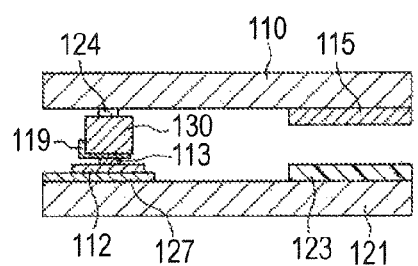

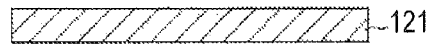
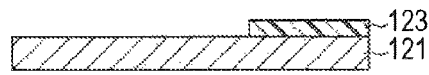
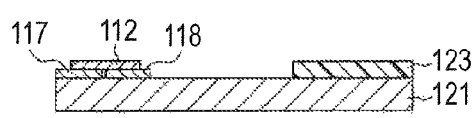
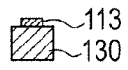
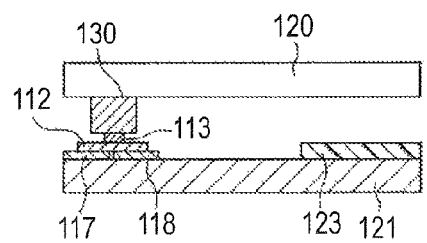
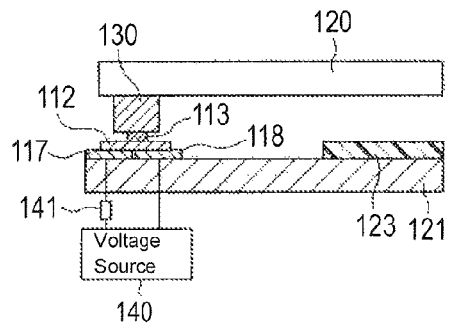
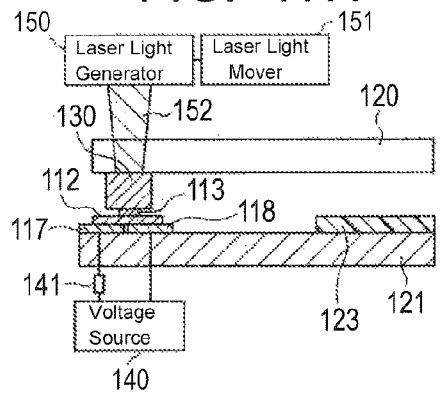
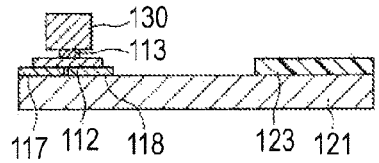
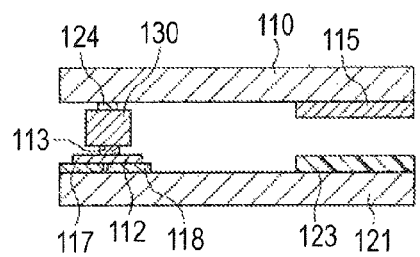

FIG. 19A1
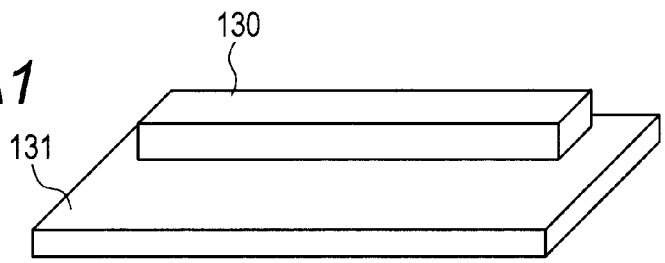
FIG. 19A2
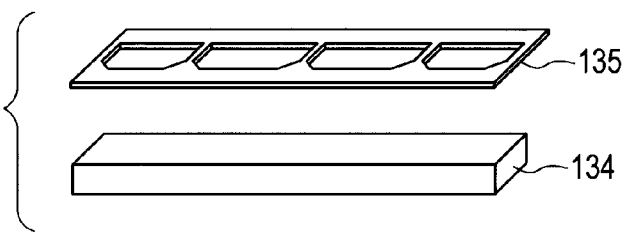
FIG. 19B
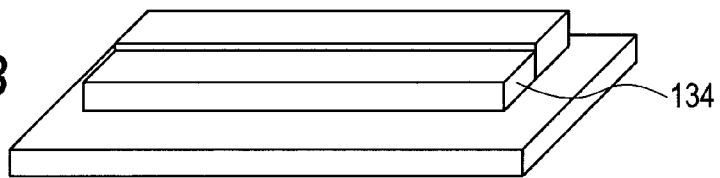
FIG. 19C
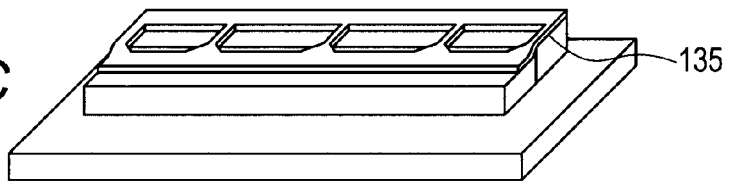
FIG. 19D
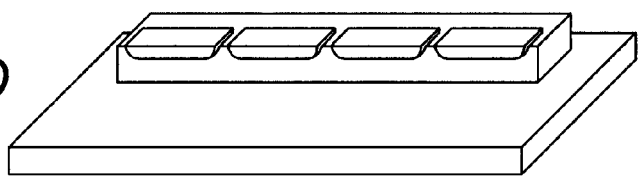
FIG. 19E
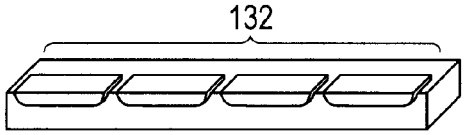

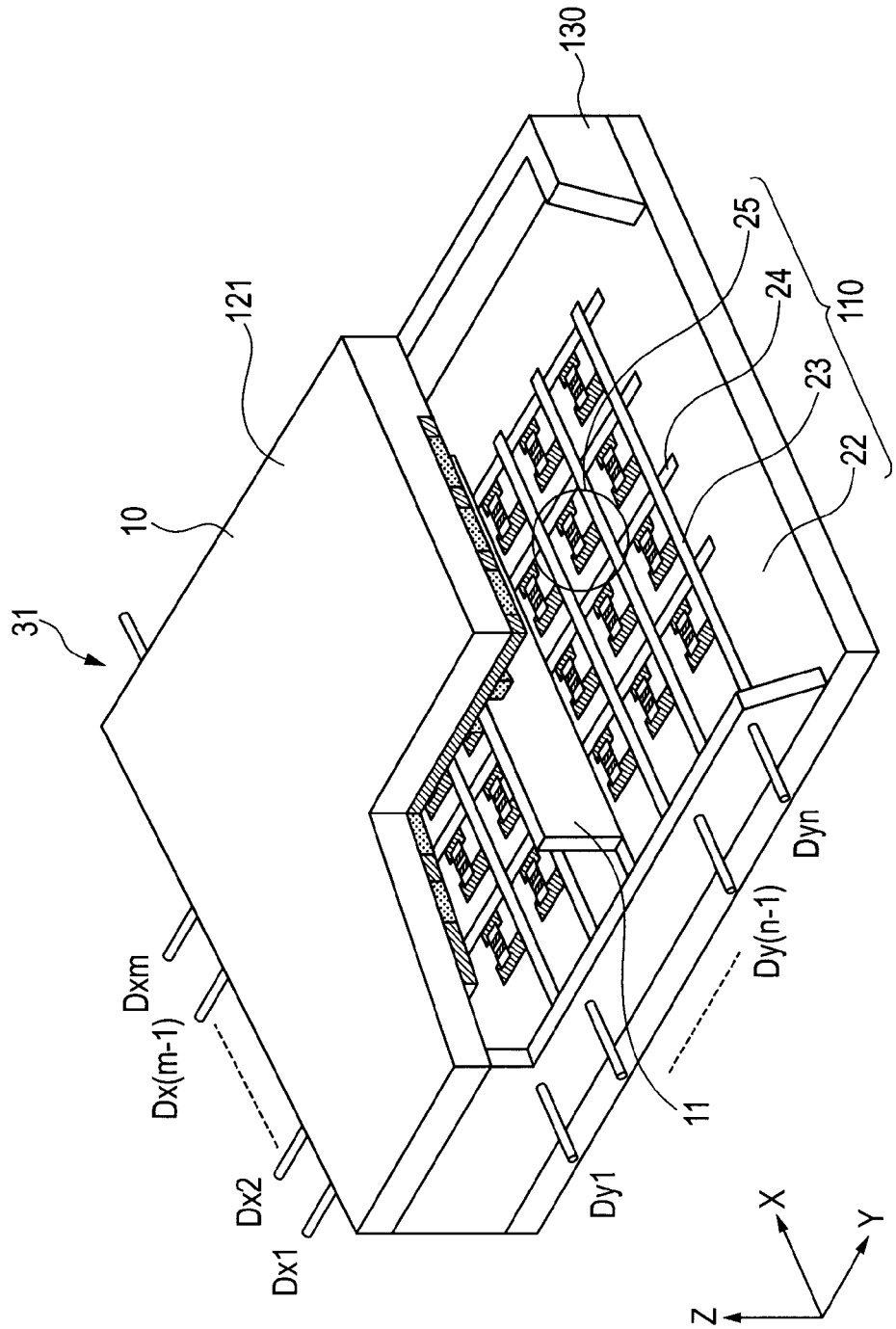

MANUFACTURING METHOD OF HERMETICALLY SEALED CONTAINER

BACKGROUND OF THE INVENTION

1. Field of the Invention

The present invention relates to a manufacturing method of a hermetically sealed container. The present invention particularly relates to a manufacturing method of a display panel having a device provided therein which may have lower performance by the ingression of oxygen, water and the like.

2. Description of the Related Art

Image display apparatuses of a flat panel type such as an organic LED display (OLED), a field emission display (FED) and a plasma display panel (PDP) are well-known. These image display apparatuses are provided with an envelope which is manufactured by hermetically bonding glass substrates that oppose each other and has an inner space isolated from an outer space. In order to manufacture these hermetically sealed containers, a space-specifying member and a local adhesive material are arranged between the glass substrates that oppose each other as needed, a bonding material is arranged in the periphery so as to form a frame shape, and the materials are heated to be bonded. As for a method of heating a bonding material, there are known a method of baking the overall glass substrate in a heating furnace and a method of selectively heating the periphery of the bonding material by local heating. The local heating is more advantageous than the overall heating, from the viewpoint of heating and cooling periods of time, energy necessary for heating, productivity, the prevention of thermal deformation of a container, the prevention of thermal degradation of a functional device arranged in the inside of the container and the like. Particularly, a laser light is known as a unit of the local heating. It is also known that the manufacturing method of the hermetically sealed container by using a local heating unit can be applied to a manufacturing method of a vacuum heat-insulating glass which does not have a functional device provided therein.

A manufacturing method of an envelope of an OLED is disclosed in U.S. Patent No. 2006/0084348. Firstly, an assembled structure is prepared that includes a first glass substrate and a second glass substrate which sandwich a bonding material arranged so as to form a perimeter. Next, this assembled structure is scanned by being irradiated with a local heating light, while keeping the state sandwiched with a pair of a transparent silica disks. Thereby, the bonding material in a perimeter is melted, and the first glass substrate and the second glass substrate are hermetically sealed.

A manufacturing method of an envelope of an OLED is disclosed in U.S. Patent No. 2009/0044496. Firstly, a frit glass is formed in a perimeter having a corner portion on the first glass substrate which has been employed as a supporting substrate. The first glass substrate having the frit glass provided thereon and the second glass substrate are opposed to each other to sandwich the frit glass, and are assembled. In the assembly, the first glass substrate and the second glass substrate are pressurized by a mechanical unit from the outside, and the adhesivity in a bonding material region is secured.

Thus, bonding methods are known which do not simply irradiate a glass substrate that is a material to be bonded and a bonding material with a laser light, but have variously improved an assembly method, so as to secure the adhesivity between the bonding material and the glass substrate when having been irradiated with the laser light.

However, there has been the case in which adhesivity between the glass substrate that is the material to be bonded and the bonding material is insufficient in an assembled stage before the bonding is finished, and a bonding failure occurs. The securement of the adhesivity which is a subject of the present invention will be described in detail below.

The above described adhesivity is associated with a relationship between the size of a region to be locally heated and a substantial uneven pitch on the surface of a bonding material in a region scheduled to be bonded. FIGS. 4A to 4F are sectional views illustrating a state of the bonding of a substrate 101 and a frame member 103. FIGS. 4A to 4F illustrate the case in which the bonding material is provided on a substrate 101 side for convenience, but the following description is also applied to the case in which the bonding material is provided on a frame member 103 side. In addition, the following description is also applied to the case in which substrates are bonded to each other, or the case in which a substrate is bonded to a substrate having the frame member provided thereon. FIG. 4A illustrates a contacting state in a pressurizing step in the case in which the uneven pitch on the surface of the bonding material 104 is smaller than a region 107 to be irradiated with a laser light (diameter of laser spot), and FIG. 4B illustrates a contacting state when the bonding material has been irradiated with the laser light in the pressurizing step. Because the bonding material 104 is swollen and deformed by being softened and melted, a leveling action of the bonding material 104 is expected even in a region in which the bonding material 104 is not brought in contact with the frame member 103 in an unheated stage. For this reason, continuous bonding can be obtained in the region which has been irradiated with the laser light.

On the other hand, when the uneven pitch of the surface of the bonding material 104 is larger than that of the region 107 to be irradiated with the laser light, the following problem occurs. FIG. 4C illustrates a contacting state in the pressurizing step, and FIG. 4D illustrates a contacting state when the bonding material has been irradiated with the laser light in the pressurizing step. Because the uneven pitch of the surface of the bonding material 104 is large, even when the bonding material 104 is swollen and deformed by being softened and melted, a sufficient leveling action does not occur in the bonding material 104. Because of this, a bonding failure 105 partially occurs in a bonded portion. Generally, when the uneven pitches of the surfaces of the substrate and the frame member are sufficiently larger than the plate thicknesses of the substrate and the frame member, the substrate and the frame member are wholly pressed through an unshown cover plate, accordingly the substrate, the frame member and the cover plate are warped, and the overall adhesivity is easily secured. However, even in that case, an uneven pattern of a long pitch locally remains on the surface of the bonding material, and accordingly the adhesion failure occasionally occurs. In the case of overall heating, the bonding material also is wholly heated, accordingly a leveling action occurs simultaneously in a wide range, and such a problem resists occurring comparatively. In contrast to this, in the case of local heating, the bonding material is not softened and melted in a place other than the region to be locally heated, and accordingly a range in which the leveling action occurs is limited. Because of this, a partial bonding failure tends to easily occur.

There is also the case in which particles inevitably get mixed in a region scheduled to be bonded. FIG. 4E illustrates a contacting state in a pressurizing step, and FIG. 4F illustrates a contacting state when the bonding material has been irradiated with a laser light in the pressurizing step. The bonding material 104 is swollen and deformed along with being softened and melted, but the degree of deformation is not sufficient to cause the leveling action in the periphery of the particles 106, and accordingly the bonding failure 107 partially occurs in the bonded portion.

There is the case in which the partial bonding failure occurs also by the thermal expansion and thermal shrinkage of the substrate and the frame member in a portion to be locally heated. This is also a phenomenon peculiar to the local heating.

As described above, when materials are hermetically bonded with the local heating unit, it is extremely important to reduce a noncontact region in an unheated stage as much as possible, though perfect adhesivity such as in an optical contact is not needed.

Pressurization by a mechanical pressing unit as is disclosed in U.S. patent No. 2009/0044496 is indirect pressurization through a firm structure, the pressing force resists being uniformly applied to the materials, and accordingly there has been the case in which the pressurization is not necessarily sufficient for suppressing the adhesion failure. For this reason, a method has been desired which locally heats the region in a state of resisting being affected by the uneven pattern of a long pitch on the surface of the bonding material and the mixing particle, and making an adhesive force more uniformly applied to the materials.

An object of the present invention is to provide a manufacturing method of a hermetically sealed container, which improves adhesivity in a region to be bonded and thereby enhances the reliability, when sealing a container to be hermetically sealed by the scan of the locally heating unit.

SUMMARY OF THE INVENTION

According to a one aspect of the present invention, a manufacturing method of a hermetic container having first and second dielectric substrates comprises: a step of providing a first electrode on one of the first and second substrates, while providing a second electrode divided into a plurality of segments for simultaneously applying thereto potentials different from each other on the other of the first and second substrates; a step of arranging a bonding material between the first and second substrates, so that the first and second electrodes are opposed to each other sandwiching the bonding material therebetween; and a first bonding step of heating the bonding material while pressing the first and second substrates to each other to bond the first and second substrates together, wherein the first bonding step includes steps of: pressing the first and second substrates to each other by an electrostatic force generated between the first and second electrodes by applying a potential difference between the first and second electrodes; softening and melting the bonding material, and then cooling and solidifying the bonding material, by simultaneously performing the heating by a local heating unit and moving the local heating unit relatively against the bonding material; and increasing the potential difference between the first electrode and the segment of the second electrode at which the heating by the heating unit is performed.

According to a further aspect of the present invention, a manufacturing method of a hermetic container having first and second dielectric substrates comprises: a step of providing a first electrode on one of the first and second substrates, while providing a second electrode divided into a plurality of segments for simultaneously applying thereto potentials different from each other on the other of the first and second substrates; a step of arranging a bonding material between the first and second substrates, so that the first and second electrodes are opposed to each other sandwiching the bonding material therebetween; and a first bonding step of heating the bonding material while pressing the first and second substrates to each other to bond the first and second substrates together, wherein the first bonding step includes steps of: pressing the first and second substrates to each other by an electrostatic force generated between the first and second electrodes by applying a potential difference between the first and second electrodes; softening and melting the bonding material, and then cooling and solidifying the bonding material, by simultaneously forming a locally heated spot in the bonding material and moving the local heated spot relatively against the bonding material; and increasing the potential difference between the first electrode and the segment of the second electrode at which the locally heated spot is positioned correspondingly to the moving of the locally heated spot.

According to a further aspect of the present invention, a manufacturing method of a hermetic container having first and second dielectric substrates comprises: a step of providing a first electrode operating also as a bonding material on one of the first and second substrates, while providing a second electrode divided into a plurality of segments for simultaneously applying thereto potentials different from each other on the other of the first and second substrates; a step of arranging the first and second substrates, so that the first and second electrodes are opposed to each other; and a first bonding step of heating the first electrode while pressing the first and second substrates to each other to bond the first and second substrates together, wherein the first bonding step includes steps of: pressing the first and second substrates to each other by an electrostatic force generated between the first and second electrodes by applying a potential difference between the first and second electrodes; softening and melting the first electrode, and then cooling and solidifying the first electrode, by simultaneously forming a locally heated spot in the bonding material and moving the local heated spot relatively against the bonding material; and increasing the potential difference between the first electrode and the segment of the second electrode at which the locally heated spot is positioned correspondingly to the moving of the locally heated spot.

According to a further aspect of the present invention, a manufacturing method of a hermetic container having first and second dielectric substrates comprises: a step of providing a first electrode and a second electrode divided into a plurality of segments for simultaneously applying thereto potentials different from each other on the other of the first and second substrates, to form a gap between the first and second electrodes, on one of the first and second substrates; a step of arranging a bonding material between the first and second substrates, so that the first and second electrodes are opposed to the bonding material; and a first bonding step of heating the bonding material while pressing the first and second substrates to each other to bonding the first and second substrates together, wherein the first bonding step includes steps of: pressing the first and second substrates to each other by an electrostatic force generated between the first and second electrodes by applying a potential difference between the first and second electrodes; softening and melting the bonding material, and then cooling and solidifying the bonding material, by simultaneously forming a locally heated spot in the bonding material and moving the local heated spot relatively against the bonding material; and increasing the potential difference between the first electrode and the segment of the second electrode at which the locally heated spot is positioned correspondingly to the moving of the locally heated spot.

According to a further aspect of the present invention, a manufacturing method of a hermetic container having first and second dielectric substrates comprises: a step of providing a first electrode and a second electrode operating also as a bonding material and divided into a plurality of segments for simultaneously applying thereto potentials different from each other on the other of the first and second substrates, to form a gap between the first and second electrodes, on one of the first and second substrates, while providing; a step of arranging the first and second substrates, so that the first and second electrodes are opposed to the second substrate; and a first bonding step of heating the first electrode while pressing the first and second substrates to each other to bond the first and second substrates together, wherein the first bonding step includes steps of: pressing the first and second substrates to each other by an electrostatic force generated between the first and second electrodes by applying a potential difference between the first and second electrodes; softening and melting the first electrode, and then cooling and solidifying the first electrode, by simultaneously forming a locally heated spot in the bonding material and moving the local heated spot relatively against the bonding material; and increasing the potential difference between the first electrode and the segment of the second electrode at which the locally heated spot is positioned correspondingly to the moving of the locally heated spot.

According to the present invention, a manufacturing method of a hermetically sealed container can be provided which improves adhesivity in a region to be sealed when conducting a step of sealing the container to be hermetically sealed by the scan of the locally heating unit, and thereby enhances the reliability.

Further features of the present invention will become apparent from the following description of exemplary embodiments with reference to the attached drawings.

BRIEF DESCRIPTION OF THE DRAWINGS

FIGS. 1A, 1B, 1C and 1D are schematic views illustrating a first embodiment of the present invention.

FIG. 2 is a flow chart illustrating each step in the first embodiment.

FIG. 6 is a timing chart illustrating the movements of a region to be locally heated and a region of application of the maximum voltage.

FIGS. 8A, 8B, 8C and 8D are schematic views illustrating a third embodiment of the present invention.

FIGS. 16A, 16B, 16C, 16D, 16E, 16F, 16G, 16H, 16I and 16J are views illustrating each step in the second embodiment.

FIGS. 17A, 17B, 17C, 17D, 17E, 17F, 17G, 17H, 17I and 17J are views illustrating each step in the third embodiment.

FIGS. 19A1, 19A2, 19B, 19C, 19D and 19E are views illustrating one example of a method of forming the second electrode.

FIG. 20 is a partially-ruptured perspective view illustrating one example of an FED, to which the present invention is applied.

DESCRIPTION OF THE EMBODIMENTS

Preferred embodiments of the present invention will now be described in detail in accordance with the accompanying drawings.

The present invention can be suitably applied to a hermetically sealed container of a display having the device provided in the inside of the container, which needs to prevent the ingression of a gas from the outside in order to keep its operational characteristics. A manufacturing method of a hermetically sealed container according to the present invention can provide a highly reliable hermeticity, and accordingly can be applied, for instance, to a manufacturing method of a hermetically sealed vacuum container of an organic light-emitting diode (OLED) display panel provided with a charge-emitting element. The present invention can be applied also to a fluorescent display (VFD) provided with an electron-emitting element.

However, the present invention can further be applied to a manufacturing method of an FED which has a cold cathode electron source provided therein as an electron-emitting element and has a cathode luminescent element provided therein as an image-forming member, from the following reasons. The first reason is that the alignment accuracy of two substrates to each other, in other words, the alignment accuracy of a pixel array of electron sources and the pixel array of phosphors is easily secured. This is because the bonding material is partially melted, the whole bonding material is not melted and softened simultaneously, and accordingly most parts in the structure are kept in a state of ordinary temperatures and normal pressures. The second reason is that the deterioration by a thermal process of the electron-emitting device is suppressed. This is because only a portion to be bonded is locally heated due to the above described partial melting, and the electron-emitting element in the inside of the panel is not almost affected by the heating. Thereby, the oxidization of the electron-emitting element, and the evaporation and decomposition of an element which has adsorbed onto the outermost surface of the electron-emitting element are suppressed. The cold cathode electron source includes a Spindt type, a surface-electron-conduction type and a carbon nanotube type.

Figure 3A:
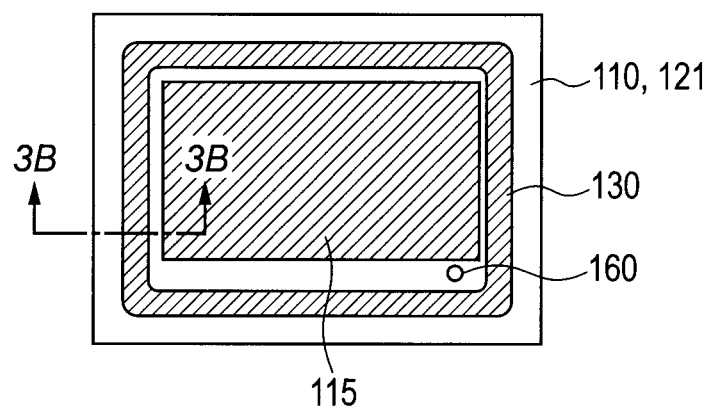
FIGS. 3A and 3B are schematic views of a cold cathode display provided with a hermetically sealed container to which the first embodiment is applied.
Figure 3B:
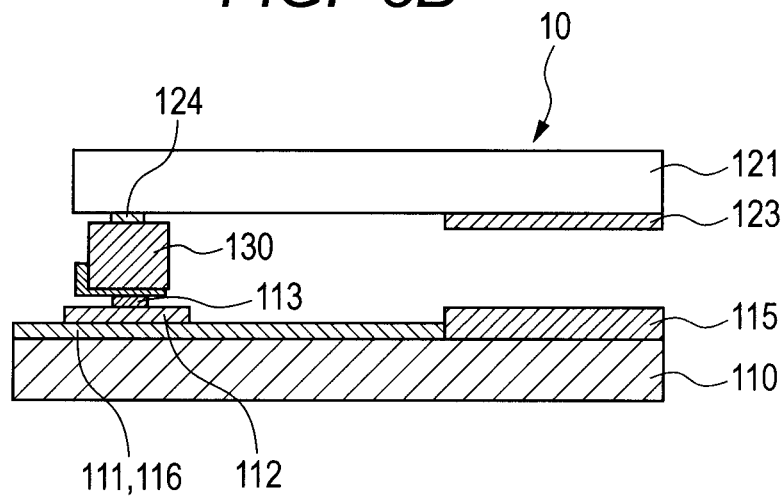
Figure 4A:
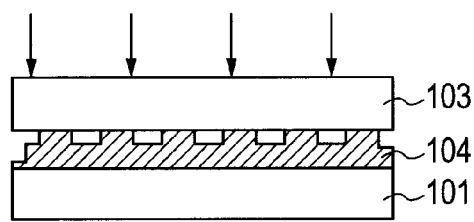
FIGS. 4A, 4B, 4C, 4D, 4D and 4F are views for describing the subject of the present invention.
Figure 4B:
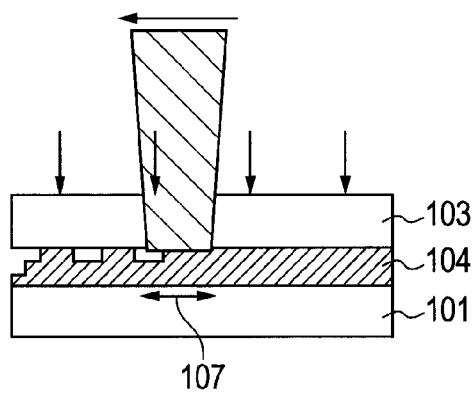
Figure 4C:
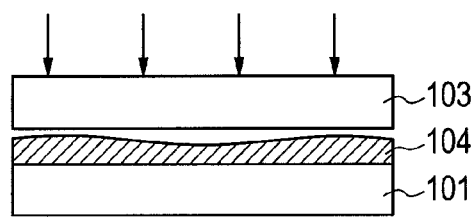
Figure 4D:
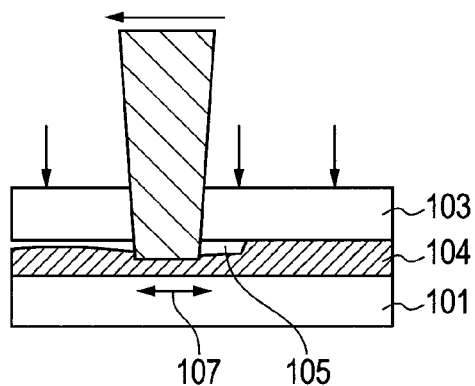
Figure 4E:
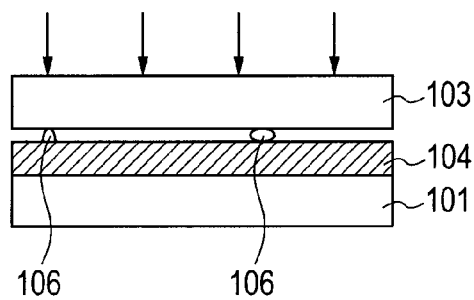
Figure 4F:
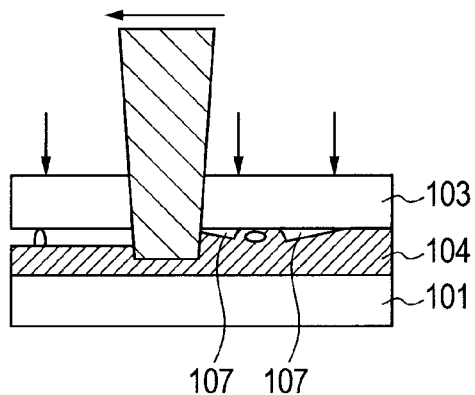

FIG. 20 is a partially-ruptured perspective view illustrating an example of a basic structure of an image display apparatus to which the present invention is applied. FIGS. 3A and 3B are sectional views of the image display apparatus, FIG. 3A is a plan view, and FIG. 3B is a sectional view taken along the line 3B-3B of FIG. 3A. The image display apparatus 31 has a rear plate 110 and a face plate 121 which is positioned so as to oppose the rear plate 110. The face plate 121 and the rear plate 110 form a hermetically sealed container 10 together with a frame member 130. The hermetically sealed container 10 has a spacer 11 provided therein which is positioned between the rear plate 110 and the face plate 121, and supports the rear plate 110 and the face plate 121 mutually. The spacer 11 is formed of a high-resistance member, and can pass a small amount of an electric current therein in order to prevent a static charge thereof. The image display apparatus 31 includes an unshown power supply, a driving circuit and the like in addition to the hermetically sealed container 10.

The rear plate 110 includes a glass substrate 22, a scan wiring 23, a signal wiring 24 and a two-dimensionally arrayed plurality of surface conduction electron-emitting devices 25 formed on the glass substrate 22. The scan wiring 23 has N lines, the signal wiring 24 has M lines, and N×M pieces of the surface conduction electron-emitting devices 25 are formed in a matrix form. N and M are positive integers, and are appropriately set according to an intended display pixel number. In the case of FHD (Full High Definition), for instance, N is 1,080 lines, and M is 1,920×3=5,760 lines.

In the present invention, the hermetically sealed container 10 including the rear plate 110, the face plate 121 and the frame member 130 is manufactured by using the scan of a local heating unit. At this time, the adhesivity in the region to be bonded can be selectively enhanced because the manufacturing method uses the electrostatic force by a capacitor as a pressing force. Because of this, a hermetically sealed container structure having higher hermeticity can be obtained. Particularly, when there are unevenness due to the wiring, dirt, unevenness on the surface of the bonding material and the like in the periphery of a container to be hermetically sealed, the present invention can be effectively used.

The present invention is divided into the first embodiment to the fourth embodiment according to the structural member on which an electrode of the capacitor is arranged. The arrangement relationship of the electrode in each embodiment is shown in Table 1. Each embodiment further includes a modified embodiment according to whether the bonding material is dielectric or electroconductive. The first and the second embodiments are in such a relationship that the first electrode is formed on any one of the first substrate and the second substrate, and the second electrode is formed on the other one of the first substrate and the second substrate. The third and the fourth embodiments are in such a relationship that the first electrode and the second electrode are formed on any one of the first substrate and the second substrate.

TABLE 1

| | Bonding material | Member which forms first electrode | Member which forms second electrode |
|---|---|---|---|
| First embodiment | Dielectric | First substrate | Second substrate |
| | Electro-conductive | First substrate First electrode serves as bonding material. | Second substrate |
| Second embodiment | Dielectric | Second substrate | First substrate |
| | Electro-conductive | Second substrate First electrode serves as bonding material. | First substrate |

TABLE 1-continued

| | Bonding material | Member which forms first electrode | Member which forms second electrode |
|---|---|---|---|
| Third embodiment | Dielectric | First substrate | On first substrate and outside of first electrode |
| | Electro-conductive | First substrate First electrode serves as bonding material. | On first substrate and outside of first electrode |
| Fourth embodiment | Dielectric | Second substrate | On second substrate and outside of first electrode |
| | Electro-conductive | Second substrate First electrode serves as bonding material. | On second substrate and outside of first electrode |

In the present specification, the first substrate and the second substrate mean a substrate which can obtain adhesivity respectively between the substrate and the bonding material by using a pressing force due to the electrostatic force, and are dielectric. The second substrate includes a flat plate substrate which can be arranged so as to oppose to the first substrate, but is not limited to the flat plate substrate, and includes a frame member which can be arranged so as to oppose to the first substrate, and an integrated member of the frame member and the flat plate substrate, in which the flat plate substrate and the frame member are integrally connected. The first substrate means any one of the face plate and the rear plate, which depends on the embodiment. The first electrode means an electrode to which a common voltage is applied regardless of whether being segmented or not, and the second electrode means an electrode which is segmented, and of which the applied voltage can be controlled for every segment. The first electrode and the second electrode have a different member provided thereon according to the embodiment. The first bonding step means a step of bonding the first substrate to the second substrate, and the second bonding step means a step of bonding a counter substrate to the frame member, which is conducted when needed in order to integrate the frame member with the counter substrate.

Embodiments in which the manufacturing method according to the present invention is applied to a manufacturing method of an envelope of an FED panel will be specifically described below with reference to the drawings.

First Embodiment

The first embodiment according to the present invention will be specifically described below with reference to FIGS. 14A to 14M, FIG. 2, FIGS. 1A to 1D, FIG. 6, FIGS. 15A to 15J, FIGS. 7A to 7F and FIGS. 11A to 11D.

FIGS. 14A to 14M and FIG. 2 are explanatory views illustrating the order of steps in a manufacturing method according to the first embodiment. FIGS. 1A to 1D are explanatory views illustrating an arrangement relationship between each member and the apparatus when having used a laser light for a local heating unit. FIG. 1A is a sectional view illustrating the first bonding step, and corresponds to the step illustrated in FIG. 14J. FIG. 1B is a perspective view of FIG. 1A (The illustration of a laser light generating apparatus and a laser head moving apparatus is omitted). FIG. 1C is a plan view which is viewed from the 1C-1C line of FIG. 1A, and FIG. 1D is a plan view which is viewed from the 1D-1D line of FIG. 1A (The illustration of a part in the downside from the bonding material is omitted).

In the following description, each step is distinguished by the figure numbers 14A to 14M of FIGS. 14A to 14M. In FIGS. 14A to 14M, only a portion corresponding to a region scheduled to be bonded of one part of a container to be hermetically sealed is illustrated for simplifying the illustration.

(Step shown in FIG. 14A) Firstly, a rear plate 110 made from glass is prepared as the first substrate. The rear plate 110 is desirably formed from an alkali-free glass or a high strain point glass.

(Step shown in FIG. 14B) Next, a surface-electron-conduction type electron-emitting source (unshown) which is an electron-emitting device, and a region 115 having electron-emitting devices formed thereon and a matrix wiring 111 (scan wiring 23 and signal wiring 24 illustrated in FIG. 20) are formed in the central part of the rear plate 110. The matrix wiring 111 constitutes one part of the first electrode 116. The matrix wiring 111 is led to four circumferential parts of the rear plate 110, and forms a leading portion to be connected to an external circuit. There are regions in which the matrix wiring 111 is not formed in the four corners of the rear plate 110. An electrode 129 (see FIG. 7B) is separately formed on the region in which the matrix wiring 111 is not formed, and the first electrodes 116 are formed over the whole region scheduled to be bonded on the first substrate 110. Next, an insulation layer 112 is formed on the region scheduled to be bonded. The insulation layer 112 is arbitrarily provided for the purpose of preventing the first electrode 116 and the second electrode 132 from forming a short circuit when the bonding material has been softened and melted in a bonding step. In order to secure the pressurizing force (pressing force), the film thickness of the insulation layer 112 is desirably small, and the film thickness is selected desirably to be 0.1 μm to 20 μm. When the matrix wiring 111 and the region 115 having electron-emitting devices formed thereon are formed, an unshown interlayer insulation layer is formed, and accordingly the insulation layer 112 can be prepared simultaneously with this interlayer insulation layer.

(Step shown in FIG. 14C) Next, a bonding material 113 is formed on the insulation layer 112. In the present embodiment, the bonding material 113 may be any one of dielectrics and a conductor.

(Step shown in FIG. 14D) Next, a frame member 130 is prepared. An alkali-free glass or a high strain point glass can be applied to the frame member 130.

(Step shown in FIG. 14E) A second electrode 132 which is formed of an ITO electrode and has been segmented is formed on the frame member 130. One example (segments 132a to 132d) of the segment is illustrated in FIG. 1B. The number of the segments can be arbitrarily selected, and it is also possible to divide the full length of the region scheduled to be bonded of the rear plate 110, in other words, the length of the whole perimeter, into four lengths in consideration of each side as one segment. However, it is possible to further finely segment each side because the further segmentation can more precisely control the pressurizing force.

(Step shown in FIG. 14F) Next, a face plate 121 is prepared.

(Step shown in FIG. 14G) An anode formed from an electroconductive material and a phosphor formation region 123 formed of a phosphor pattern are formed on the central part on the face plate 121.

(Step shown in FIG. 14H) A bonding material 124 is formed on the region scheduled to be bonded of the face plate 121.

Figure 14A:
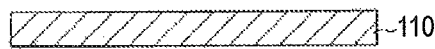
FIGS. 14A, 14B, 14C, 14D, 14E, 14F, 14G, 14H, 14I, 14J, 14K, 14L and 14M are views illustrating each step in the first embodiment.
Figure 14B:
Figure 14C:
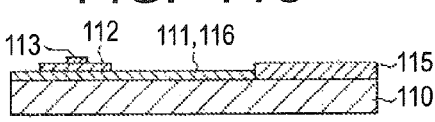
Figure 14D:
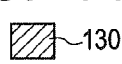
Figure 14E:
Figure 14F:
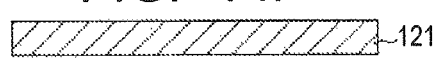
Figure 14G:
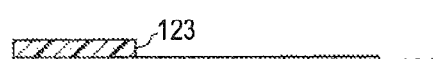
Figure 14H:
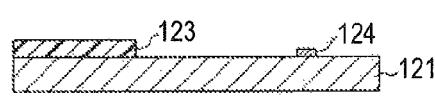

(Step shown in FIG. 14I) The frame member 130 which has been formed in a step shown in FIG. 14E is bonded to the face plate 121 which has been formed in a step shown in FIG. 14H. An arbitrary method such as an overall heating unit by an atmosphere heating furnace can be applied to the above described bonding method. In the above way, the second substrate is prepared.

Figure 14I:
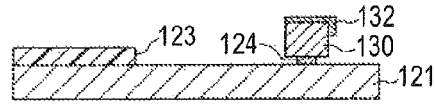

(Step shown in FIG. 14J) The rear plate 110 which has been formed in a step shown in FIG. 14C, and the integrated member of the face plate 121 and the frame member 130, which has been formed a step shown in FIG. 14I, are arranged so as to oppose to each other to form an assembly structure. At this time, the bonding material 113 on the first substrate 110 is brought in contact with the second electrode 132 on the frame member 130 so that the regions scheduled to be bonded abut on each other. The rear plate 110 and the face plate 121 are aligned as needed, and the pixel patterns of the region 115 having electron-emitting devices formed thereon and the phosphor formation region 123 are opposed to each other.

Figure 14J:
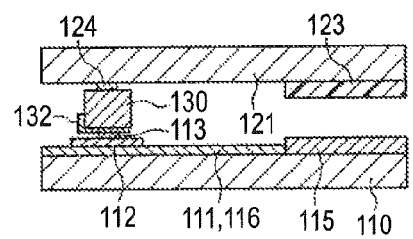

(Step shown in FIG. 14K) A voltage source 140 is connected to the assembly structure which has been formed in a step shown in FIG. 14J. The voltage source 140 is a voltage source having a multichannel output, and two poles are output therefrom. A first pole is connected to the first electrode 116, and a second pole is connected to the second electrode 132 through a prober. The first pole is connected so as to be capable of simultaneously applying a common potential to the matrix wiring 111 and the electrodes 129 which have been separately provided in the four corners of the rear plate 110. The common potential can be the GND potential in order to simplify the structure of the device. The second pole of the voltage source 140 can determine the potential of every segment in the second electrode 132, based on the movement position information of the laser head, which is obtained from the laser head moving apparatus 151 that will be described in the next step.

Figure 14K:
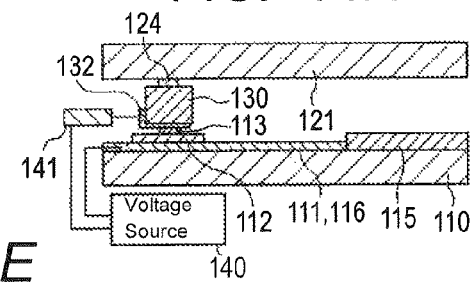

(Step shown in FIG. 14L) The laser light generating apparatus 150 is set up so as to form an optical arrangement in which the apparatus can irradiate the region scheduled to be bonded of the assembly structure that has been formed in a step shown in FIG. 14K, with a laser light. The laser light generating apparatus 150 is moved above the assembly structure by the laser head moving apparatus 151 while irradiating the assembly structure with the laser light 152, and sequentially bonds the region scheduled to be hermetically bonded. At this time, the voltage pattern to be applied to every segment of the second electrode 132 from the voltage source 140 is varied according to the position of the laser head.

FIG. 6 is a timing chart showing a relationship between the position of a laser beam and the voltage pattern to be applied to every segment. The timing chart takes a period of time t in the abscissa, and shows a potential Vo of the first electrode 116, a potential difference between the second electrode 132 and the first electrode 116 and an irradiation position x of the laser light in the ordinates sequentially from above. The potential difference between the second electrode 132 and the first electrode 116 is illustrated as potential differences V(i)−Vo, V(i+1)−Vo and V(i+2)−Vo, which are those between three respective adjacent segments 132b to 132d of the second electrode 132 and the first electrode 116. The potential of the first electrode 116 is set at the GND potential, in other words, 0 V. The matrix wiring 111 which constitutes one part of the first electrode 116 is divided into portions 111a to 111g, and the same potential (0V) is applied to any portion. The potentials of every segment 132b to 132d in the second electrode 132 have characteristics of a trapezoidal potential curve which has the minimum potential set at 50 V and the maximum potential set at 220 V, and are adjusted so that the potential curves of every segment are shifted while keeping the fixed time difference, according to the irradiation position of the laser light. Specifically, in the segment of the second electrode, which is in a position to be heated by the laser light generating apparatus 150, the potential difference between the second electrode 132 and the first electrode 116 is controlled to increase up to the maximum potential difference and hold the maximum potential difference for a predetermined period. In addition, this potential difference is controlled to decrease after the bonding material 113 has been cooled and solidified. The beam position (shown by numeral 152) illustrated in FIG. 1D corresponds to the laser head position at the time t1 of FIG. 6.

(Step shown in FIG. 14M) The laser light scans the whole region scheduled to be hermetically bonded while the irradiation position of the laser light and the position of application of the maximum voltage of the second electrode 132 are moved in this way, and the hermetic seal bonding operation is completed. After that, the voltage source 140 is disconnected from the prober 141, and the completed hermetically sealed container is taken out from the laser light generating apparatus 150 and the laser head moving apparatus 151.

Figure 14L:
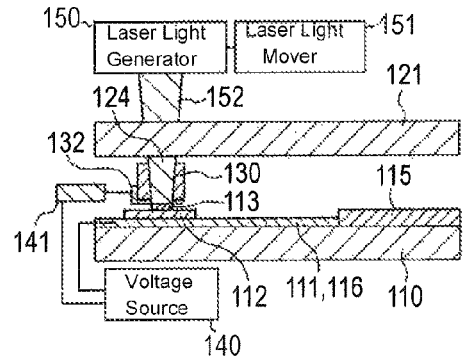
Figure 14M:
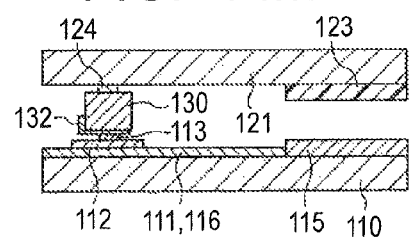
Figure 15A:
FIGS. 15A, 15B, 15C, 15D, 15E, 15F, 15G, 15H, 15I and 15J are views illustrating each step in the first embodiment (modified example).
Figure 15B:
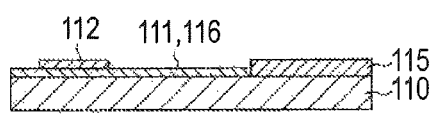
Figure 15C:
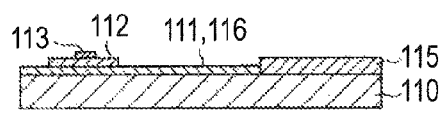
Figure 15D:
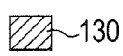
Figure 15E:
Figure 15F:
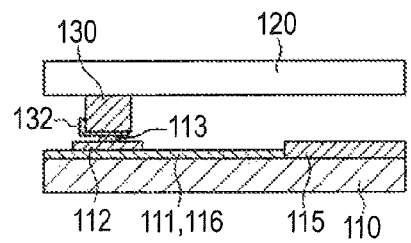
Figure 15G:
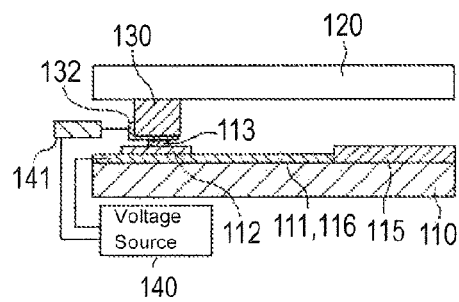
Figure 15H:
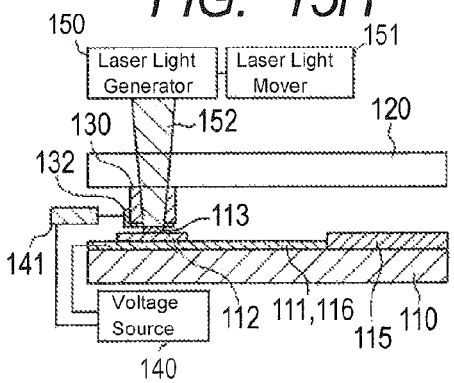
Figure 15I:
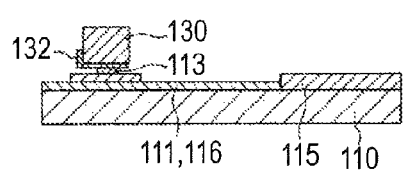
Figure 15J:
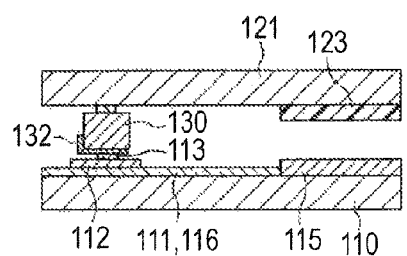

FIGS. 15A to 15J are views illustrating the order of manufacturing steps in a modified example of the first embodiment. In the steps illustrated in FIGS. 14A to 14M, the step of bonding the face plate 121 to the frame member 130 and the step shown in FIG. 14I which illustrates the second bonding step are conducted prior to the step shown in FIG. 14L which illustrates the first bonding step. In contrast to this, in the modified example illustrated in FIGS. 15A to 15J, the first bonding step of FIG. 15H is firstly conducted. After that, in FIG. 15J which illustrates the second bonding step, the face plate 121 which is the second substrate is bonded to the assembly structure of the first substrate 110 and the frame member 130. In this modified example, in steps of FIGS. 15F to 15H, a cover glass 120 having transmission properties with respect to the wavelength of the laser light to be used in FIG. 15H can be used in order to hold the first substrate 110 and the frame member 130.

In the first embodiment according to the present invention, the second electrode 132 provided on the frame member 130, the first electrode 116 provided on the first substrate and a dielectric layer which are positioned between the electrodes constitute a parallel flat-plate type capacitor. This capacitor generates an electrostatic force by a potential having been given to itself, and makes the second substrate provided with the frame member 130 and the first substrate pressed to each other. At this time, the voltage applied to the segment is increased that is positioned in the vicinity of the position to be heated, in other words, the irradiation position of the laser light, which temporarily increases the pressing force. As long as the first embodiment according to the present invention satisfies such conditions, the embodiment is not limited to the methods disclosed in FIGS. 14A to 14M and FIGS. 15A to 15J.

The first embodiment can apply for the modified embodiments as illustrated in FIGS. 7A to 7F and FIGS. 11A to 11D according to the type of the bonding material 113, the type of the device on the rear plate 110 and the like.

Figure 7A:
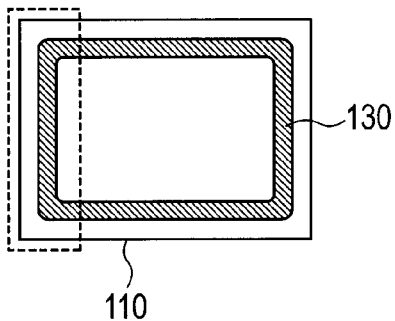
FIGS. 7A, 7B, 7C, 7D, 7E and 7F are examples of a pattern of a second electrode which can be applied to the first embodiment of the present invention.
Figure 7B:
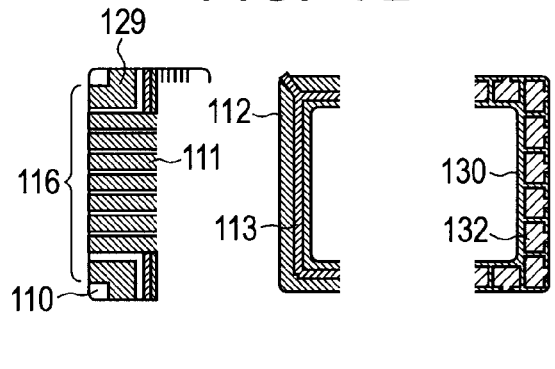
Figure 7C:
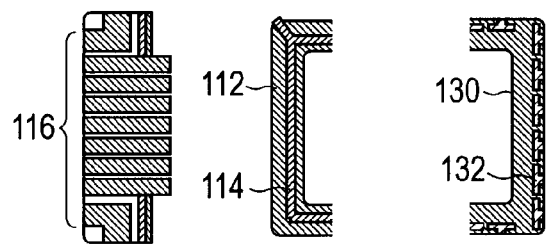
Figure 7D:
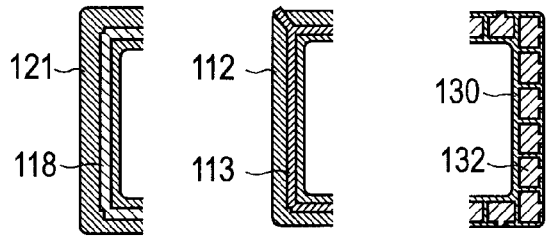

FIGS. 7A to 7F illustrate patterns of the first electrode and the second electrode in the first embodiment. FIG. 7A illustrates a whole plan view of the rear plate 110 and the frame member 130, and FIGS. 7B to 7D illustrate a partial plan view of a region surrounded by the dashed line in FIG. 7A. FIGS. 7B to 7D illustrate a state in which each laminated member is cut out at each height to be three portions.

FIG. 7B corresponds to FIG. 1C. In FIG. 7B, a left part illustrates the rear plate 110 and the first electrode 116 provided thereon, the central part illustrates the insulation layer 112 and the bonding material 113, and a right part illustrates the frame member 130 and the second electrode 132 provided thereon, each in a simplified form.

Figure 11A:
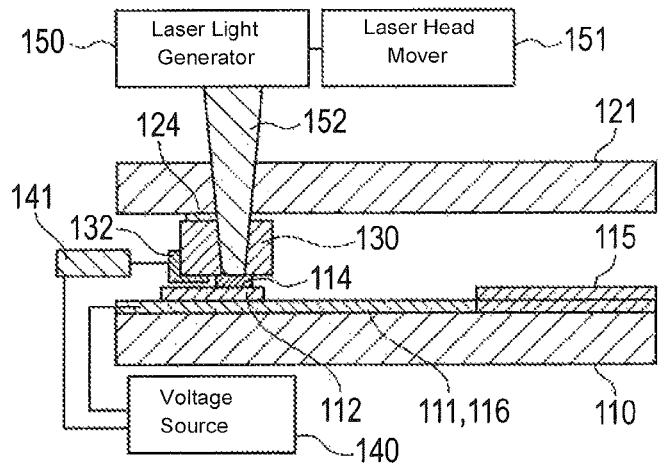
FIGS. 11A, 11B, 11C and 11D are views illustrating a modified example of the first embodiment.

FIG. 7C is a similar view in which an electroconductive material such as AlSi is used as a bonding material 114. FIG. 11A illustrates a sectional view for describing the first bonding step in this case.

Figure 11B:
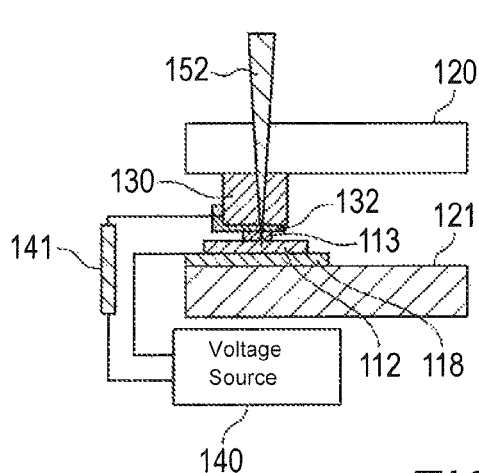

FIG. 7D illustrates an example in the case in which a face plate 121 having no matrix wiring thereon is used as the first substrate. FIG. 11B illustrates the first bonding step in this case, and an Al wire 118 with a shape of a closed perimeter is provided as the first electrode instead of the matrix wiring group illustrated in FIG. 7B.

Figure 11C:
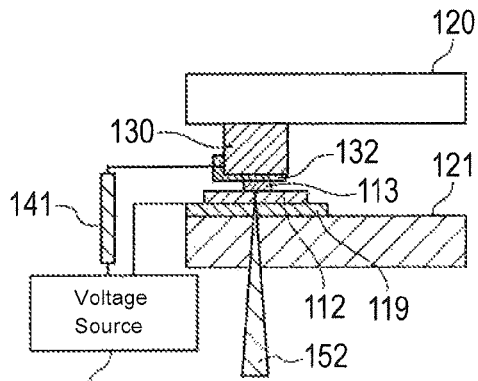
Figure 11D:
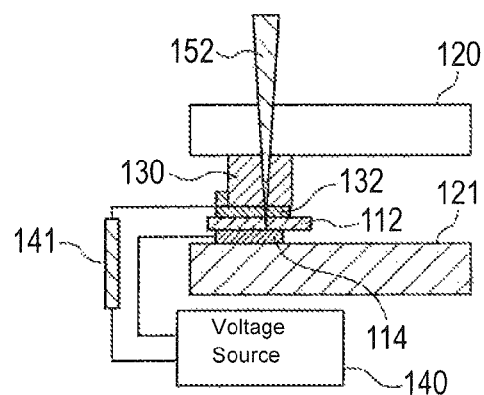

Furthermore, referring to FIG. 11C as another modified example, the example has an ITO electrode 119 with a shape of a closed perimeter provided on the face plate 121, instead of the Al wire 118 illustrated in FIG. 11B, and the laser light 152 irradiates the bonding material through the face plate 121 and the ITO electrode 119. Referring to FIG. 11D, the bonding material 114 formed of a perimeter-shaped AlSi thin film is provided instead of the matrix wiring group illustrated in FIG. 7B.

Second Embodiment

Next, the second embodiment according to the present invention will be described below with reference to FIGS. 16A to 16J, FIGS. 5A to 5C and FIGS. 7A to 7F. In FIGS. 16A to 16J, only a portion corresponding to a region scheduled to be bonded of one part of a container to be hermetically sealed is illustrated for simplifying the illustration.

(Step shown in FIG. 16A) Firstly, the face plate 121 made from glass is prepared as the first substrate. The face plate 121 is desirably formed from an alkali-free glass or a high strain point glass.

(Step shown in FIG. 16B) Next, the anode formed from an electroconductive material and the phosphor formation region 123 formed of a phosphor pattern are formed on the central part on the face plate 121. Furthermore, a second electrode 127 which is formed of a segmented Al electrode and an insulation layer 112 are formed in the periphery of the face plate 121 so as to form a perimeter. The number of the segments can be arbitrarily selected, and it is also possible to divide the full length of the region scheduled to be bonded of the face plate 121, in other words, the length of the whole perimeter, into four lengths in consideration of each side as one segment. However, it is possible to more finely segment each side because the finer segmentation can more precisely control the pressurizing force.

(Step shown in FIG. 16C) Next, the bonding material 113 is formed on the insulation layer 112. In the present embodiment, the bonding material 113 may be any one of dielectrics and a conductor, but here, a dielectric frit glass is selected.

(Step shown in FIG. 16D) Next, the frame member 130 is prepared. The frame member 130 is desirably formed from an alkali-free glass or a high strain point glass.

(Step shown in FIG. 16E) Next, a first electrode 119 formed from an Al electrode is formed on the frame member 130.

(Step shown in FIG. 16F) Next, the frame member 130 which has been formed in the step shown in FIG. 16E is assembled with the face plate 121 which has been formed in the step shown in FIG. 16C. At this time, the bonding material 113 is made to abut on the first electrode 119 so that the regions scheduled to be bonded abut on each other. The cover glass 120 having transmission properties with respect to the wavelength of the laser light to be used in FIG. 16H can be used in order to hold the assembly structure.

(Step shown in FIG. 16G) The voltage source 140 is connected to the assembly structure which has been formed in the step shown in FIG. 16F. The voltage source 140 is the voltage source 140 having the multichannel output, and two poles are output therefrom. The first pole is connected to the first electrode 119, and the second pole is connected to the second electrode 127 through the prober 141. The first electrode 119 is connected so as to be capable of simultaneously applying a common potential. The common potential can be the GND potential in order to simplify the structure of the device. The second pole of the voltage source 140 can determine the potential of every segment in the second electrode 127, based on the movement position information of the laser head, which is obtained from the laser head moving apparatus 151 that will be described in the next step.

(Step shown in FIG. 16H) The laser light generating apparatus 150 is set up so as to form an optical arrangement in which the apparatus can irradiate the region scheduled to be bonded of the assembly structure that has been formed in FIG. 16G, with a laser light. The laser light generating apparatus 150 is moved above the assembly structure by the laser head moving apparatus 151 while irradiating the assembly structure with the laser light 152, and sequentially bonds the region scheduled to be hermetically bonded. At this time, the voltage pattern to be applied to every segment in the second electrode 127 from the voltage source 140 is varied according to the position of the laser head. The movement pattern of the applied voltage can be changed by a method similar to that in the first embodiment illustrated in FIG. 6.

(Step shown in FIG. 16I) The laser light scans the whole region scheduled to be hermetically bonded while the irradiation position of the laser light and the position of application of the maximum voltage are moved in this way, and the hermetic seal bonding operation is completed. After that, the voltage source 140 is disconnected from the prober 141, and the laser light generating apparatus 150 and the laser head moving apparatus 151 are removed.

(Step shown in FIG. 16J) The rear plate 110 is hermetically bonded to the bonded body of the face plate 121 and the frame member 130, which has been prepared in FIG. 16I, with an arbitrary bonding method, and a hermetically sealed container is completed.

The variations as illustrated in FIGS. 5A to 5C and FIGS. 7A to 7F can be applied to the first bonding step, according to the type of the bonding material and the type of a device on the face plate 121.

Figure 5A:
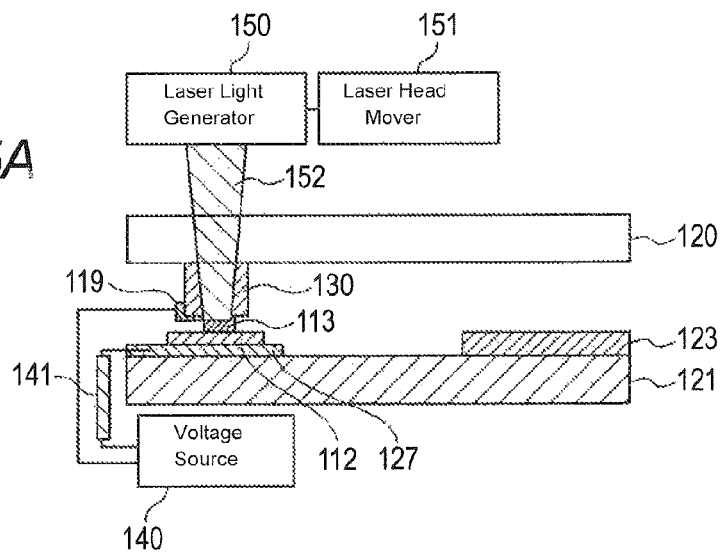
FIGS. 5A, 5B and 5C are schematic views illustrating a second embodiment of the present invention.
Figure 5B:
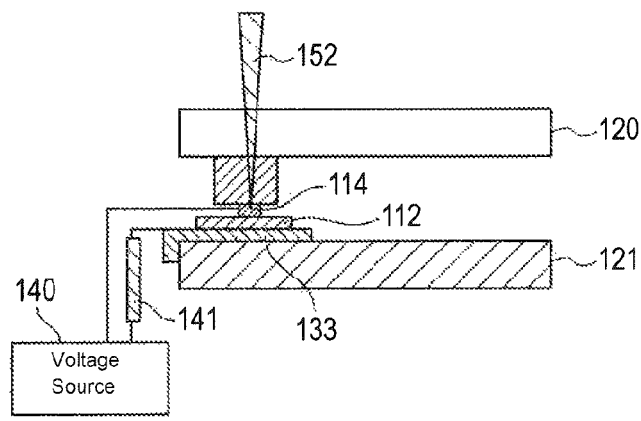
Figure 5C:
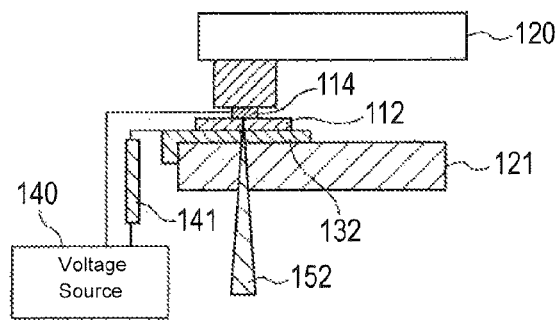
Figure 7E:
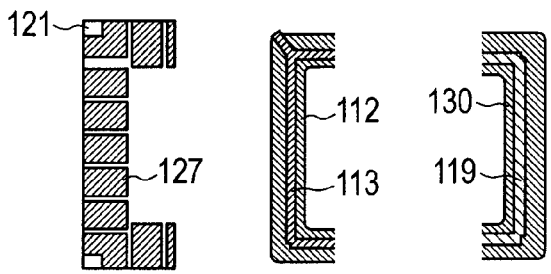
Figure 7F:
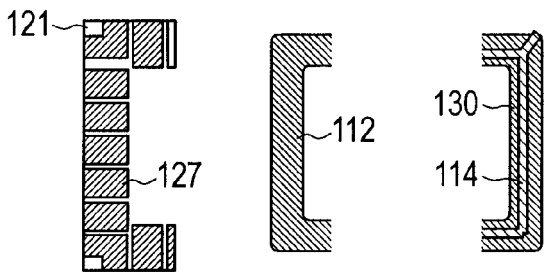

FIG. 7E and FIG. 7F illustrate the patterns of the first electrode and the second electrode in the second embodiment. FIGS. 7E to 7F illustrate a partial plan view of the region surrounded by the dashed line of FIG. 7A. The way of viewing these figures is similar to that in FIGS. 7B to 7D. FIG. 7E is an example of the arrangement pattern of the face plate 121, the second electrode 127, the insulation layer 112, the bonding material 113, the frame member 130 and the first electrode 119, which corresponds to FIG. 5A. FIG. 7F illustrates an example in the case in which an electroconductive material such as AlSi is used as the bonding material 114. FIGS. 5B and 5C illustrate sectional views for describing the first bonding step in this case. FIG. 5B illustrates an example in which the laser light 152 irradiates the bonding material from the frame member 130 side, and FIG. 5C illustrates an example in which the laser light 152 irradiates the bonding material from the face plate 121 side.

In the second embodiment, the first electrode 119 provided on the frame member 130, the second electrode 127 provided on the first substrate and a dielectric layer which are positioned between the electrodes constitute a parallel flat-plate type electrostatic capacitor. This capacitor generates an electrostatic force by a potential having been given to itself, and makes the frame member 130 and the first substrate pressed to each other. At this time, the voltage applied to the segment is increased that is positioned in the vicinity of the position to be heated, in other words, the irradiation position of the laser light, which temporarily increases the pressing force. As long as the second embodiment according to the present invention satisfies such conditions, the embodiment is not limited to the methods disclosed in FIGS. 16A to 16J.

Third Embodiment

Next, the third embodiment according to the present invention will be described below with reference to FIGS. 17A to 17J, FIGS. 13A to 13G, and FIGS. 8A to 8D. In these figures, only a portion corresponding to a region scheduled to be bonded of one part of a container to be hermetically sealed is illustrated for simplifying the illustration.

(Step shown in FIG. 17A) Firstly, the face plate 121 made from glass is prepared as the first substrate.

(Step shown in FIG. 17B) Next, the anode formed from an electroconductive material and the phosphor formation region 123 formed of a phosphor pattern are formed on the central part on the face plate 121.

(Step shown in FIG. 17C) Next, a first electrode 118 formed of an Al electrode with a shape of a closed perimeter is arranged in the periphery of the first substrate 110. Furthermore, A second electrode 117 formed of a segmented Al electrode is formed in the outside of the first electrode 118 so as to have a gap between the second electrode 117 and the first electrode 118 to form a perimeter. The number of the segments can be arbitrarily selected, and it is also possible to divide the full length of the region scheduled to be bonded of the face plate 121, in other words, the length of the whole perimeter, into four lengths in consideration of each side as one segment. However, it is possible to more finely segment each side because the finer segmentation can more precisely control the pressurizing force. Electrodes 117 and 118 are provided on the same plane of the face plate 121. Furthermore, an insulation layer 112 is formed so as to astride the electrodes 117 and 118.

(Step shown in FIG. 17D) Next, the frame member 130 is prepared.

(Step shown in FIG. 17E) Next, the bonding material 113 is formed on the frame member 130. In the present embodiment, the bonding material 113 may be any one of dielectrics and a conductor, but here, a dielectric frit glass is selected.

(Step shown in FIG. 17F) The frame member 130 which has been formed in the step shown in FIG. 17E is assembled with the face plate 121 which has been formed in the step shown in FIG. 17C. At this time, the bonding material 113 is opposed to the electrodes 117 and 118 so that the regions scheduled to be bonded abut on each other. The cover glass 120 having transmission properties with respect to the wavelength of the laser light to be used in the step shown in FIG. 17H can be used in order to hold the assembly structure.

(Step shown in FIG. 17G) The voltage source 140 is connected to the assembly structure which has been formed in the step shown in FIG. 17F. The voltage source 140 is the voltage source 140 having the multichannel output, and two poles are output therefrom. The first pole is connected to the first electrode 118, and the second pole is connected to the second electrode 117 through the prober 141. The first electrode 118 is connected so as to be capable of simultaneously applying a common potential. The common potential can be the GND potential in order to simplify the structure of the device. The second pole of the voltage source 140 can determine the potential of every segment in the second electrode 117, based on the movement position information of the laser head, which is obtained from the laser head moving apparatus 151 that will be described in the next step.

(Step shown in FIG. 17H) The laser light generating apparatus 150 is set up so as to form an optical arrangement in which the apparatus can irradiate the region scheduled to be bonded of the assembly structure that has been formed in the step shown in FIG. 17G, with a laser light. The laser light generating apparatus 150 is moved above the assembly structure by the laser head moving apparatus 151 while irradiating the assembly structure with the laser light 152, and sequentially bonds the region scheduled to be hermetically bonded. At this time, the voltage pattern to be applied to every segment in the second electrode 117 from the voltage source 140 is varied according to the position of the laser head. An alternating wave which transits between a positive potential and a negative potential is applied between the first electrode 118 and the second electrode 117. The movement pattern of the applied voltage can be changed by a method similar to that in the first embodiment illustrated in FIG. 6.

(Step shown in FIG. 17I) The laser light scans the whole region scheduled to be hermetically bonded while the irradiation position of the laser light and the position of application of the maximum voltage of the second electrode 117 are moved in this way, and the hermetic seal bonding operation is completed. After that, the voltage source 140 is disconnected from the prober 141, and the laser light generating apparatus 150 and the laser head moving apparatus 151 are removed.

(Step shown in FIG. 17J) The rear plate 110 is hermetically bonded to the integrated member of the face plate 121 and the frame member 130, which has been prepared in the step shown in FIG. 17I, with an arbitrary bonding method, and a hermetically sealed container is completed.

The variations as illustrated in FIGS. 8A to 8D and FIGS. 13A to 13G can be applied to the first bonding step in the third embodiment, according to the type of the bonding material and the type of a device on the face plate.

Figure 13A:
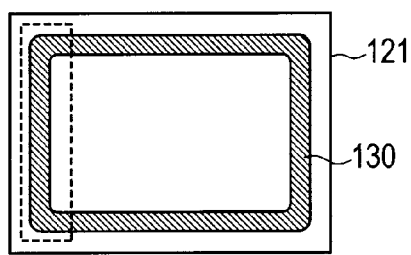
FIGS. 13A, 13B, 13C, 13D, 13E, 13F and 13G are examples of a pattern of a second electrode in the third and fourth embodiments.
Figure 13B:
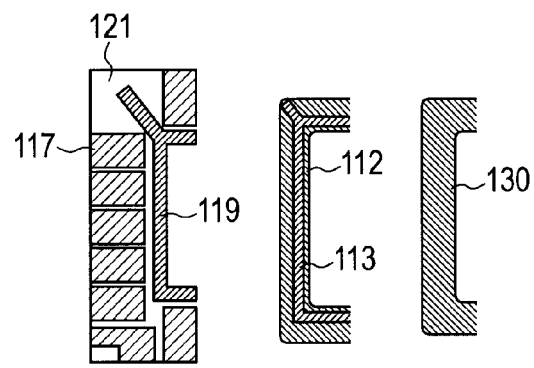
Figure 13C:
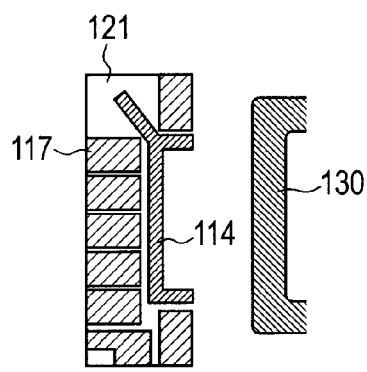

FIGS. 13A to 13G illustrate the patterns of the first electrode and the second electrode in the third embodiment, and the way of viewing these figures is similar to that in FIGS. 7A to 7F. FIG. 13B is an example of the arrangement pattern of the face plate 121, the first and second electrodes 118 and 117, the insulation layer 112, the bonding material 113 and the frame member 130, which corresponds to FIG. 8A. The laser light 152 may also irradiate the bonding material from the opposite side as is illustrated in FIG. 8B. FIG. 13C illustrates an example in the case in which an electroconductive material such as an AlSi alloy has been applied as the bonding material 114. FIG. 8C illustrates a sectional view for describing the first bonding step in this case. The laser light 152 may also irradiate the bonding material from the opposite side as is illustrated in FIG. 8D.

Figure 13D:
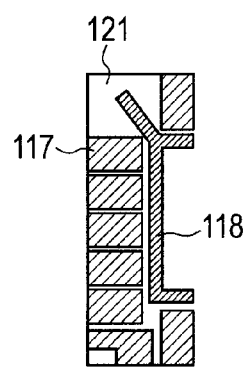
Figure 13E:
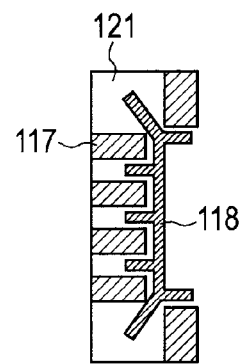

The second electrode 117 can be divided into finer segments than those in FIG. 13B, as in FIG. 13D which is illustrated as a modified example of the electrode pattern of FIG. 13B. A bridge 118a which has been bridged from the closed loop of the first electrode 118 can also be provided between segments adjacent to each other in the second electrode 117, as is illustrated in FIG. 13E. The bridge 118a is grounded. The capacitance between the first and the second electrodes 118 and 117 increases due to the provided bridge 118a, and accordingly an effective area to which an electrostatic force is applied can be increased.

In the third embodiment, the second electrode 117 (segmented electrode) provided on the first substrate, the first electrode 118 and a dielectric layer constitute an electric dipole type capacitor. This capacitor generates an electrostatic force by a potential having been given to itself, and makes the frame member 130 and the first substrate pressed to each other. At this time, the voltage applied to the segment is increased that is positioned in the vicinity of the position to be heated, in other words, the irradiation position of the laser light, which temporarily increases the pressing force. As long as the third embodiment according to the present invention satisfies such conditions, the embodiment is not limited to the methods disclosed in FIGS. 17A to 17J.

Fourth Embodiment

Next, the fourth embodiment according to the present invention will be described below with reference to FIGS. 18A to 18J and FIGS. 13A to 13G. In these figures, only a portion corresponding to a region scheduled to be bonded of one part of a container to be hermetically sealed is illustrated for simplifying the illustration.

(Step shown in FIG. 18A) Firstly, the face plate 121 made from glass is prepared as the first substrate.

(Step shown in FIG. 18B) Next, the anode formed from an electroconductive material and the phosphor formation region 123 formed of a phosphor pattern are formed on the central part on the face plate 121.

(Step shown in FIG. 18C) Next, the frame member 130 is prepared.

Figure 13F:
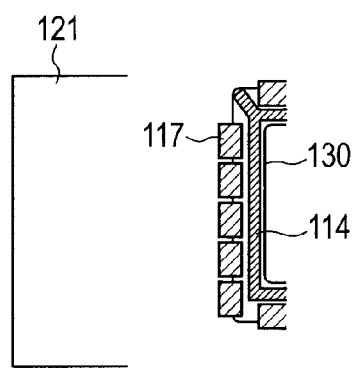

(Step shown in FIG. 18D) Next, the second electrode 117 which is formed of a segmented Al electrode is arranged on the frame member 130 so as to form the perimeter, as is illustrated in FIG. 13F. The number of the segments can be arbitrarily selected, and it is also possible to divide the full length of the region scheduled to be bonded of the frame member 130, in other words, the length of the whole perimeter, into four lengths in consideration of each side as one segment. However, it is possible to more finely segment each side because the finer segmentation can more precisely control the pressurizing force.

(Step shown in FIG. 18E) Next, an AlSi alloy thin film having an approximately rectangular pattern with a closed perimeter is formed on the frame member 130. The AlSi alloy thin film is the first electrode 114, and serves as a bonding material.

Figure 18A:
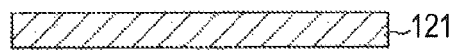
FIGS. 18A, 18B, 18C, 18D, 18E, 18F, 18G, 18H, 18I and 18J are views illustrating each step in the fourth embodiment.
Figure 18B:
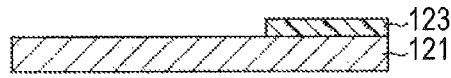
Figure 18C:
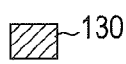
Figure 18D:
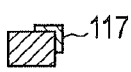
Figure 18E:

(Step shown in FIG. 18F) The frame member 130 which has been formed in FIG. 18E is assembled with the face plate 121 which has been formed in the step shown in FIG. 18B. At this time, the frame member 130 and the face plate 121 are aligned so that the regions scheduled to be bonded abut on each other. The cover glass 120 having transmission properties with respect to the wavelength of the laser light to be used in the step shown in FIG. 18H can be used in order to hold the assembly structure.

Figure 18F:
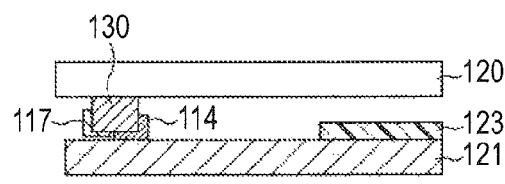

(Step shown in FIG. 18G) The voltage source 140 is connected to the assembly structure which has been formed in the step shown in FIG. 18F. The voltage source 140 is the voltage source 140 having the multichannel output, and two poles are output therefrom. The first pole is connected to the first electrode 114, and the second pole is connected to the second electrode 117 through the prober 141. The first electrode 114 is connected so as to be capable of simultaneously applying a common potential. The common potential can be the GND potential in order to simplify the structure of the device. The second pole of the voltage source 140 can determine the potential of every segment in the second electrode 117, based on the movement position information of the laser head, which is obtained from the laser head moving apparatus 151 that will be described in the next step.

Figure 18G:
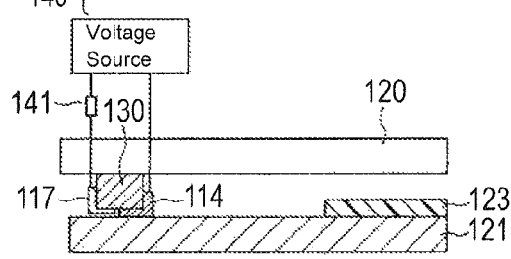
Figure 18H:
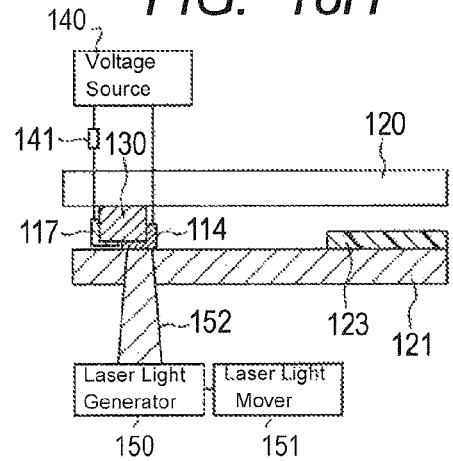

(Step shown in FIG. 18H) The laser light generating apparatus 150 is set up so as to form an optical arrangement in which the apparatus can irradiate the region scheduled to be bonded of the assembly structure that has been formed in the step shown in FIG. 18G, with a laser light. The laser light generating apparatus 150 is moved above the assembly structure by the laser head moving apparatus 151 while irradiating the assembly structure with the laser light 152, and sequentially bonds the region scheduled to be hermetically bonded. At this time, the voltage pattern to be applied to every segment in the second electrode 117 from the voltage source 140 is varied according to the position of the laser head. The movement pattern of the applied voltage can be changed by a method similar to that in the first embodiment illustrated in FIG. 6.

(Step shown in FIG. 18I) The laser light scans the whole region scheduled to be hermetically bonded while the irradiation position of the laser light and the position of application of the maximum voltage of the second electrode 117 are moved in this way, and the hermetic seal bonding operation is completed. After that, the voltage source 140 is disconnected from the prober 141, and the laser light generating apparatus 150 and the laser head moving apparatus 151 are removed.

Figure 18I:
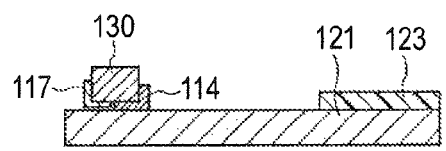
Figure 18J:
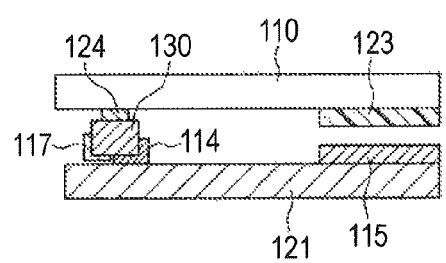

(Step shown in FIG. 18J) The rear plate 110 (second substrate) is hermetically bonded to the bonded body of the face plate 121 and the frame member 130, which has been prepared in the step shown in FIG. 18I, with an arbitrary bonding method, and a hermetically sealed container is completed.

The variations as illustrated in FIGS. 9A and 9B and FIGS. 13A to 13G can be applied to the first bonding step in the fourth embodiment, according to the type of the bonding material and the type of a device on the face plate 121.

Figure 9A:
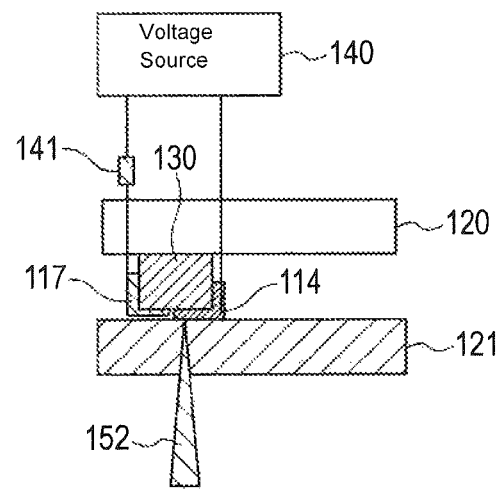
FIGS. 9A and 9B are schematic views illustrating a fourth embodiment of the present invention.
Figure 9B:
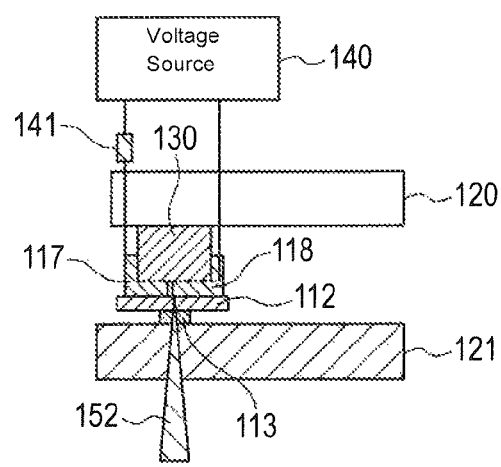
Figure 13G:
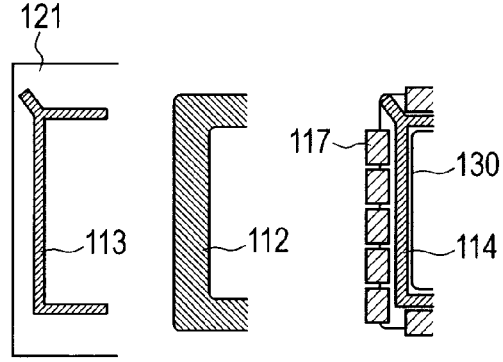

FIG. 13F shows an example of the arrangement pattern of the face plate 121, the frame member 130, the first electrode 114 and the second electrode 117, which corresponds to FIG. 9A. An electroconductive material such as an AlSi alloy is applied to the first electrode 114, and serves as a bonding material. FIG. 13G shows an example of the arrangement pattern of the face plate 121, the bonding material 113, the insulation layer 112, the frame member 130, the first electrode 118 and the second electrode 117. The first electrode 118 is provided with a bridge and the bridge is grounded. FIG. 9B illustrates a sectional view for describing the first bonding step in this case.

In the fourth embodiment, the second electrode 117 (electrode which has been segmented) provided on the frame member 130, the first electrode 114 or 118 (common electrode) and a dielectric layer constitute an electric dipole type capacitor. This capacitor generates an electrostatic force by a potential having been given to itself, and makes the frame member 130 and the first substrate pressed to each other. At this time, the voltage applied to the segment is increased that is positioned in the vicinity of the position to be heated, in other words, the irradiation position of the laser light, which temporarily increases the pressing force. As long as the fourth embodiment according to the present invention satisfies such conditions, the embodiment is not limited to the methods disclosed in FIGS. 18A to 18J.

Next, supplemental description will be added to the above described bonding method below.

(1) Preparation for Member (a) First Substrate

The first substrate is a face plate 121 or a rear plate 110 according to the embodiment. The first substrate has a first electrode, a second electrode or both of them provided thereon beforehand so as to be capable of specifying the potential of a region in the periphery of the substrate. These electrodes can be formed of a thin film having a uniform height distribution over a region scheduled to be bonded, from the viewpoint of the adhesivity in the region scheduled to be bonded. The first electrode may be continuously formed, and may also be segmented. The second electrode is segmented. When devices for image formation, which can be driven from an external circuit, are formed on the first substrate, the extended portions of the driving wiring of the devices are electrically bundled and can be formed to be the first electrode. When the devices which can be driven do not exist on the first substrate, an arbitrary electrode can be provided in the peripheral region of the first substrate as the first electrode. In this case, in order to reduce electrically connecting portions, the electrode can be formed so as to have a hollow square shape (continuous closed loop) in the periphery of the first substrate.

The device which can be driven on the first substrate includes a cold cathode electron source and an organic LED. A material having a low resistance can be selected as the first electrode and the second electrode so as to specify the potential. The suitable material includes a metal material such as Al, Cu and Ag, and a translucent electroconductive material such as an indium tin oxide (ITO). The material can be Cu from the viewpoint of heat resistance and electroconductivity. A dielectric layer having heat resistance can also be formed on the first electrode so as to alleviate the thermal damage which the first electrode receives from the bonding material in a thermal bonding process. The dielectric layer can employ a metal oxide such as $SiO_2$, and can be formed by a thin film process so as to obtain the uniformity of the shape.

(b) Second Substrate

The second substrate includes a flat plate substrate which can be arranged so as to oppose to the first substrate, but is not limited to the flat plate substrate, and includes a frame member which can be arranged so as to oppose to the first substrate, and an integrated member of the frame member and the flat plate substrate, in which the flat plate substrate and the frame member are integrally connected. The second substrate includes having the first electrode provided thereon to which a common electrode can be applied, or the second electrode provided thereon that has been divided into segments to which a potential different from that in an adjacent region can be applied, in a moving direction of a region to be locally heated, so as to be capable of specifying the potential. These electrodes can be formed of a thin film having a uniform height distribution over the region scheduled to be bonded so as to secure the adhesivity in the region scheduled to be bonded. The material to be used for the electrode can be a material having low resistance so as to specify the potential. The suitable material includes a metal material such as Al, Cu and Ag, and a translucent electroconductive material such as an indium tin oxide (ITO). The material can be Cu from the viewpoint of heat resistance or electroconductivity.

(c) Bonding Material

An inorganic adhesive, a frit glass and a metal can be applied to the bonding material. The melting point (or softening point) of the bonding material can be a low temperature in the possible range so as to alleviate the thermal effect on other members. However, when the inside of the hermetically sealed container is evacuated after the hermetic sealing step, it is necessary to notice that a container is heated in the post-step (post-process) to be conducted after the hermetic sealing step. When the region to be bonded is softened at the highest temperature in the post-process, the alignment accuracy and hermeticity decrease, and accordingly the melting point of the bonding material needs to be higher than the highest temperature of the post-process. Accordingly, the lower limit of the melting point of the bonding material is desirably determined in consideration of the temperature of the post-process.

The bonding material can employ the frit glass from the viewpoints of an expansion coefficient and wettability. When a laser for heating is used as a local heating unit, the bonding material can further be a frit glass which can obtain high absorbance for the wavelength of the laser light to be used. In order to enhance optical absorptivity, a frit containing a metal oxide filler may also be used. From the viewpoint of reducing a gas to be released in the bonding step, a bonding material made from a metal can be used. The metal which can be applied to the bonding material can be a solder material made from In and Sn, an AlGe alloy and an AlSi alloy. When the metallic bonding material is selected, a material having a higher melting point than the heating temperature in the post-process can be selected. The film-forming method of the AlSi alloy thin film is disclosed, for instance, in the following document.

Thin Solid Films, Vol. 283, No. 1 to 2, Sep. 1, 1996, p. 57 to 60, Argon entrapment in magnetron-sputtered aluminum alloy films, by Kazuyoshi Kamoshida.

(d) Locally Heating Unit

In the manufacturing method of the hermetically sealed container according to the present invention, any heating unit is applicable as long as the unit can move the region to be locally heated. For instance, an electromagnetic induction heating, a heat gun, a laser light and the like can be applied. When the hermetically sealed container is mainly formed from a translucent glass, the laser light can be used because the transparency and the absorbance of each member are usable.

Any laser light generating apparatus may be used as long as relative movement is allowed between the laser light generating apparatus and the assembly structure which is an object to be irradiated, and either or both of the laser light generating apparatus and the assembly structure can be moved. It is also acceptable to shape a beam by combining an auxiliary light source with a processing light source, for the purpose of alleviating the thermal stress to be applied to the object to be irradiated, and make these light sources simultaneously scan the object. The laser light generating apparatus may continually emit a laser light, and may also emit the laser light of a pulsed form by using a Q switch.

(2) Second Bonding Step

In the manufacturing method of the hermetically sealed container according to the present invention, an arbitrary method can be used for bonding a frame member to a flat plate substrate. However, the bonding method can be selected in consideration of the whole manufacturing steps of the hermetically sealed container. In the embodiment illustrated in FIGS. 14A to 14M, for instance, the flat plate substrate can be bonded to the frame member by an overall heating unit. On the other hand, in the embodiment illustrated in FIGS. 15A to 15J, the second bonding step is conducted after the first bonding step, and accordingly it is desirable to consider the heat resistance of a charge-emitting device existing on the first substrate. For this reason, the second bonding step can be conducted by using a locally heating unit.

Specifically, in the manufacturing method of the hermetically sealed container according to the present invention, when the substrate having a device unstable to a process temperature thereon is bonded to the frame member, a locally heating unit is desirably applied. In contrast to this, when the substrate having a device stable to the process temperature is bonded to the frame member, the overall heating unit can be applied and also a locally heating unit can be applied. In the present invention, the hermetically sealed container can be manufactured by appropriately combining these two heating units.

(3) Combination of Members (First Substrate/Bonding Material/Frame Member)

(a) Matching of Coefficients of Linear Expansion

Among the above described three members (first substrate/bonding material/second substrate (particularly, frame member)), it is desirable that the expansion coefficients substantially match with each other, in order to reduce the stress due to the effect of heating in the vicinity of the bonded interfaces between these members.

(b) Securement of Translucency

When the laser light generating apparatus is applied as a locally heating unit, the transparency of the optical path of the laser light can be secured from the viewpoint of efficient heating for the bonding material. In the embodiment illustrated in FIGS. 1A to 1D, for instance, the cover glass 120, the frame member 130 and the second electrode 132 are formed of the glass substrate, the glass frame and the ITO electrode which is a translucent electrode, respectively, and thereby the translucency is secured. In each embodiment illustrated in FIGS. 11A to 11D, the first electrode or the second electrode existing in the optical path of the laser light is formed of the ITO electrode, and thereby the translucency is secured.

(c) Metallic Bonding Material Serving as First Electrode or Second Electrode

As is illustrated in FIG. 11D, the first electrode can be formed from an AlSi alloy and the like so as to serve as a bonding material, for the purpose of reducing the number of members and steps. When the first electrode which constitutes a capacitor is formed from a metal so as to serve as a bonding material, a dielectric layer (insulation layer) may be arranged between the first electrode and the second electrode which oppose to each other. The dielectric layer can be film-formed so as to cover the first electrode which is a metallic bonding material. In order to keep a pressing force in a region which has been softened and melted, the melting point of the dielectric layer can be higher than that of the first electrode. The voltage-applied range is desirably set so that the region to which the electrostatic pressing force is applied is wider than a region to be softened and melted.

(4) Application of Electrostatic Force

The electrostatic force which is applied by a capacitor is expressed by General Expression (1). Here, $\varepsilon$ is a relative permittivity of the dielectric layer between the electrodes, Vst is applied voltage, d is a gap between the electrodes, and Pst is a pressure. In order to obtain a large electrostatic pressure at lower voltage, it is desirable to make the gap d between the electrodes small, and the dielectric constants of the insulation layer and the bonding material large.

$$Vst = d\sqrt{2\frac{Pst}{\varepsilon}} \qquad \text{General Expression (1)}$$

Figure 12A:
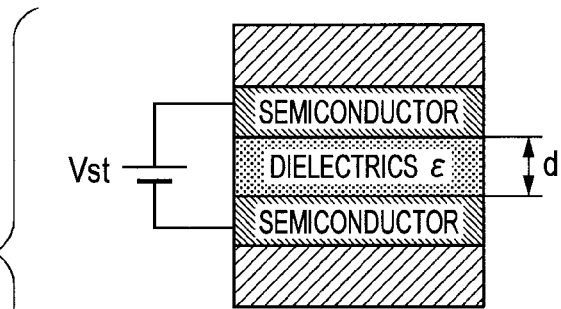
FIGS. 12A, 12B and 12C are views for describing a relationship between an electrostatic pressing force and the voltage.
Figure 12B:
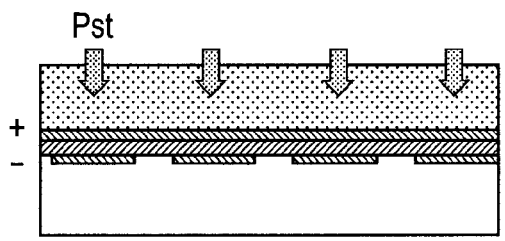
Figure 12C:
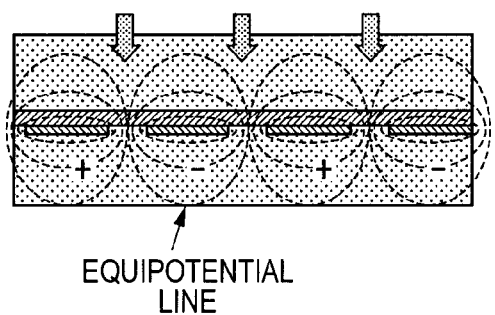

The capacitor takes a parallel flat-plate form in the first embodiment and the second embodiment (FIG. 12A), and takes an electric dipole array in the third and fourth embodiments (FIGS. 12B and 12C). The gap d between the electrodes is given by distance between the electrodes in the parallel flat-plate capacitor, and in the electric dipole capacitor, is given by distance between the centers of the electrodes× π.

In the case of the arrangement of the parallel flat-plate capacitor illustrated in FIGS. 14A to 14M and the arrangement of the electric dipole capacitor illustrated in FIG. 9B, for instance, a voltage necessary for obtaining electrostatic force 1×10⁴ Pa is as described below. In the case of FIGS. 14A to 14M, suppose that the film thickness of the insulation layer 112 is 0.5 μm, the thickness of the frit glass (bonding material) 113 is 5 μm, and the relative permittivities of the insulation layer 112 and the frit glass are 35. At this time, the required voltage becomes 50 V. In the case of FIG. 9B, suppose that the film thickness of the insulation layer 112 is 0.5 μm, the thickness of the frit glass is 5 μm, and the relative permittivities of the insulation layer 112 and the frit glass are respectively 5 and 35, the electrode width is 1 mm, and the gap between the electrodes is 100 μm. At this time, the required voltage becomes 1,000 V.

(5) Stabilization of Electrostatic Force (Gap Control)

A pressing force in a region to be bonded depends on a gap d between the electrodes, as is illustrated in General Expression (2). According to the first embodiment and the second embodiment, an effective gap in a portion to be bonded possibly becomes un-uniform by being affected by the mixing of particles and the distribution of the material characteristics of the bonding material. When the application voltage Vst is set constant and the region to be bonded is pressurized, if the supposed gap d between the electrodes becomes d+Δd by some reason, the pressing force decreases to $(1+\Delta d/d)\times 10^{-2}$. Similarly, if the supposed gap d between the electrodes becomes d−Δd by some reason, the pressing force increases to $(1-\Delta d/d)\times 10^{-2}$. In other words, in the case of voltage control, a positive feedback is applied, a narrow gap becomes narrower, a wide gap becomes wider, and the case occurs in which a constant adhesion state cannot be obtained.

$$Pst = \frac{\varepsilon}{2}\left(\frac{Vst}{d}\right)^2 \quad \text{General Expression (2)}$$

Figure 10A:
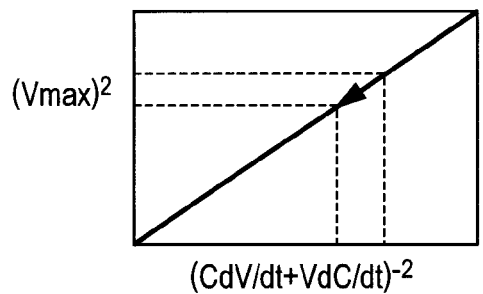
FIGS. 10A, 10B and 10C are views illustrating a method of controlling voltage application.
Figure 10B:
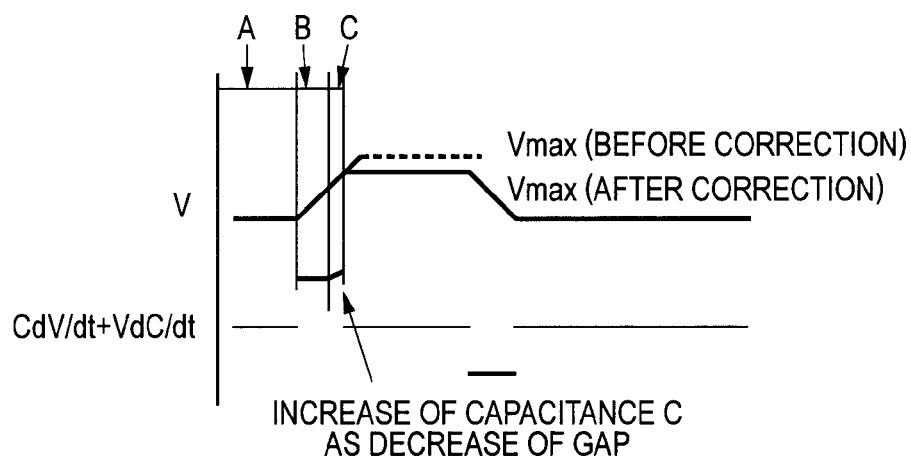

For this reason, it is desirable to estimate the transitional size of the gap, and to suppress the fluctuation of the gap and the pressing force so as to keep an electric field constant. FIG. 10A illustrates a conversion table between an observed current value and an applied voltage (Vmax) in an interval during which the maximum voltage has been applied, and FIG. 10B illustrates a temporal change of an applied voltage V and an observed current value i while taking a period of time t as an abscissa. When an electric charge to be filled in the capacitor is expressed by Q, the observed current value i is expressed by dQ/dt and consequently by i=CdV/dt+VdC/dt, because Q=CV (where C is the capacitance of the capacitor). The C is estimated from the gap d between the electrodes, which corresponds to a desired electrostatic force. The C is inversely proportional to the size of the gap, and accordingly if the gap is constant, dC/dt=0; and because the voltage V is kept at a constant value, i=CdV/dt=0. This shows the state of the interval A of FIG. 10A. Subsequently, as is illustrated in an interval B, the voltage V is gradually linearly increased. If the gap is constant, dC/dt=0, and accordingly the i results in being expressed by i=CdV/dt. Accordingly, if the voltage V is linearly increased, i expressed by i=CdV/dt takes a fixed value. This is the state of the interval B of FIG. 10A.

Here, if the gap becomes small by some reason, the value dC/dt becomes positive, and the observed electric current transitionally increases. This shows the state of the interval C of FIG. 10A. If a detector has detected such a change of the observed electric current, a controller determines that the gap has decreased, and corrects the Vmax so as to be decreased based on the conversion table. In the graph of the applied voltage, the solid line shows a state before the correction, and the dashed line shows a state in which the Vmax has been corrected so as to be decreased. If the Vmax is not corrected, the potential difference between the gaps increases according to the increase of the observed current value i, and the gap further decreases. However, the increase of the potential difference between the gaps can be suppressed by decreasing the Vmax. On the contrary, when the observed electric current transitionally decreases, the potential difference between the gaps decreases, and a predetermined electrostatic force may not be obtained. In this case, the Vmax may be corrected so as to be increased.

Thus, in the method of the present invention, the detector detects an electric current which charges the capacitor that is formed by the first electrode and the second electrode, and detects an excessively small state or an excessively large state of the gap, in the stage of increasing the potential difference up to the maximum potential difference. Then, based on the result, the controller controls the voltage between the first electrode and the second electrode, and suppresses the fluctuations of the gap and the pressurizing force in the portion to be pressurized. The maximum voltage to be applied can be corrected based on the charging current value of the capacitor, and the start time of application of the maximum voltage also can be determined based on the detection result of the charging current value. Thus, the gap and the pressurizing force of the bonded portion can be uniformed.

Figure 10C:
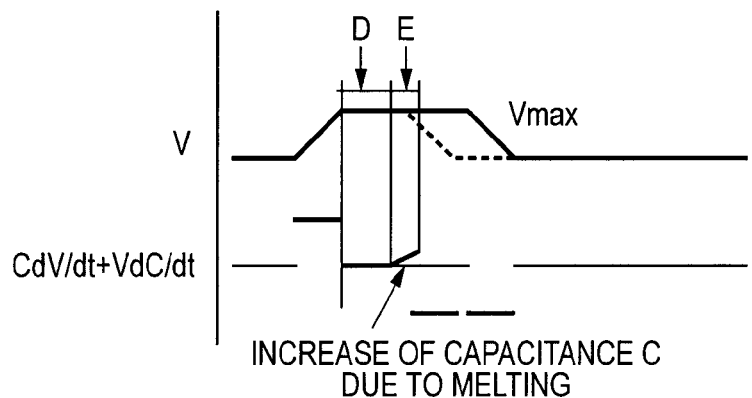

Furthermore, if an excessive thermal energy is supplied when the maximum voltage is applied and the portions are bonded, the film thickness of the bonding material occasionally remarkably decreases. When the film thickness remarkably decreases, the second electrode and the first electrode occasionally form a short circuit, which lowers the reliability of the bonding. Then, the electric current which charges the capacitor that is formed by the first electrode and the second electrode can be detected also in the stage while the potential difference stays maximum. Referring to FIG. 10C, the current value is constant (interval D) while the maximum potential difference is applied, but if the film thickness of the bonding material decreases by some reason, the gap decreases, the value dC/dt becomes positive, and the observed electric current transitionally increases. This is the state of the interval E of FIG. 10C. When such an increase of the electric current has been detected, the applied voltage is desirably immediately decreased, and more desirably is immediately decreased to the original level. This operation enables a short circuit between the first electrode and the second electrode to be prevented, and enables the hermetically sealed container to be protected from a damage due to the short circuit. In addition, by preventing the short circuit, an unnecessary damage in the manufacturing apparatus can also be prevented.

In the above way, a first bonding step can be conducted by moving the position of application of the maximum electrostatic force over the region scheduled to be bonded according to the movement of a local heating unit, while keeping the adhesivity in the heating stage. Thereby, the highly reliable manufacturing method of the hermetically sealed container can be provided.

Exemplary Embodiment 1

In the present exemplary embodiment, a hermetically sealed vacuum container was manufactured by hermetically bonding a frame member 130 to a rear plate 110 and further hermetically bonding the frame member 130 to a face plate 121, by applying a manufacturing method of the hermetically sealed container according to the first embodiment illustrated in FIGS. 14A to 14M.

Firstly, the preparation step of the rear plate 110 which is a first substrate will be described below. A substrate PD200 made by ASAHI GLASS CO., LTD. (with plane size of 1,000 mm×600 mm and thickness of 1.8 mm) was prepared (FIG. 14A). Subsequently, the rear plate 110 was subjected to cleaning by an organic solvent, rinsing by pure water and cleaning by UV-ozone, and the surface thereof was degreased. A simple matrix wiring 111 formed of Cu wires of 1,080 lines× 5,760 rows was formed on the tin-free side of the rear plate 110, and 500 pieces of Spindt-type electron sources were formed per one intersection of the matrix wiring 111. Each of the Spindt-type electron sources had a gate electrode which was connected to an unshown information signal wiring and a cathode which was similarly connected to an unshown scanning signal wiring, and formed one pixel. The intersection was formed to be a region surrounded by lines existing in the 40 mm inside from each circumferential part in the rear plate 110, and was determined to be an effective pixel area. In the periphery of the substrate outside the effective pixel area, the matrix wiring 111 was formed so as to extend to the circumferential part of the substrate. An insulation layer 112 which was formed of a silicon dioxide film ($SiO_2$ film) and had a film thickness of 1 μm was film-formed in a region with a width of 25 mm, which was surrounded by lines existing in the 5 mm inside from the circumferential part of the substrate and lines existing in the 30 mm inside therefrom (FIG. 14B), with a plasma CVD apparatus.

Furthermore, an unshown Ti film was formed to have the film thickness of 500 nm as a non-vaporizing type getter, on the wires of 1,080 lines which correspond to the scanning signal wiring out of the matrix wiring 111, with a DC sputtering method. Subsequently, an amorphous type frit glass made by ASAHI GLASS CO., LTD. was screen-printed as a bonding material 113 on the insulation layer 112. After the screen printing step, the frit glass was dried in an atmosphere drying furnace. The thickness of the frit glass was 5 μm (FIG. 14C). The softening temperature of the frit glass was 353° C., and the treatment temperature was 430° C.

Furthermore, in order to make the structure work as a hermetically sealed vacuum container, 40 pieces of spacers formed of the substrate PD200 (950 mm×1.5 mm×0.15 mm) made by ASAHI GLASS CO., LTD. were provided in the effective pixels region at equal intervals. Subsequently, an inorganic adhesive Aron Ceramics D made by Toagosei Co., Ltd. was applied to the insulation layer 112. The both ends of the spacer was fixed on the adhesive by bringing the both ends of the spacer into contact with the adhesive and locally heating the both ends with a heat gun, while applying a tension to the longitudinal direction of the spacer.

The spacer was an insulative spacer substrate which was manufactured with a heating and drawing process method and was subjected to antistatic treatment. Specifically, firstly, a mother glass before being drawn was formed so that the glass could have an unevenness with a sinusoidal pattern with a depth of 15 μm and a pitch of 50 μm on the both sides of the spacer substrate (950 mm×1.5 mm). Subsequently, a metal nitride film was formed as an antistatic film on a substrate after having been drawn, with a sputtering method. Furthermore, electrodes formed from W (tungsten) were formed on both faces (950 mm×0.15 mm) of the spacer substrate, and were enabled to be electrically connected with a cathode and an anode.

As is illustrated in FIG. 3A, an aperture 160 with a diameter of 5 mm was formed as an exhaust hole, in the rear plate 110. The position of the exhaust hole was set in the non-effective pixel region which was located in the lower right of pixel addresses (1080, 5760) when the effective pixel region was viewed from the front. This region corresponds to a position in which the exhaust hole is not interfered by a leading region of the matrix wiring 111.

Subsequently, the frame member 130 was formed which constituted one part of the second substrate. Firstly, the substrate PD200 made by ASAHI GLASS CO., LTD. with the thickness of 1.5 mm was prepared, and was cut out into a size with an outer shape of 980 mm×580 mm and a thickness of 1.5 mm. Subsequently, a region with a size of 970 mm×560 mm×a thickness of 1.5 mm in the central part of the substrate was cut out with a cutting work, and the frame member 130 having a squarish cross section of 5 mm width and 1.5 mm thickness was formed. Subsequently, the frame member 130 was subjected to cleaning by an organic solvent, rinsing by pure water and cleaning by UV-ozone, and the surface thereof was degreased (FIG. 14D).

Next, a segmented ITO thin film was formed as a second electrode 132 on the frame member 130. A method for forming the second electrode 132 will be described below with reference to FIGS. 19A1 to 19E. Firstly, the glass frame member 130 was provided on a base substrate 131 to have a film formed thereon (FIGS. 19A1 and 19A2). Subsequently, a glass substrate 134 having a height of 1.45 mm and a metal mask 135 having an aperture with a line and a space of 2.9 mm/0.1 mm therein were prepared (FIG. 19A2). Subsequently, the glass substrate 134 was pressed as a glass mask, against the frame member 130 from the side of the frame member 130 (FIG. 19B). Subsequently, the metal mask 135 was aligned on the glass substrate 134 (FIG. 19C). Subsequently, the ITO thin film was formed on the frame member to have a film thickness of 100 nm, with a DC sputtering method, and after that, the glass mask 134 and the metal mask 135 were removed (FIG. 19D). After that, the frame member 130 having the segmented electrode 132 formed thereon was removed from the base substrate 131 (FIG. 19E). In the above way, the segmented second electrode 132 was formed on the frame member 130. By forming the second electrode 132 in the region on the side of the frame member 130, which was continuous to the side of the region scheduled to be bonded of the frame member 130, a region to which an electrostatic force is applied and a region for electrical connection were secured.

Next, the second substrate was formed by bonding the frame member 130 to the face plate 121. Specifically, the face plate 121 was prepared from the substrate PD200 made by ASAHI GLASS CO., LTD., and the face plate 121 was cleaned in a similar way to that for the rear plate 110 which was the first substrate (FIG. 14F). Subsequently, an anode formed from an electroconductive material and a phosphor formation region 123 formed of a phosphor pattern were formed on the central part of the tin-free face side of the face plate 121 (FIG. 14G). Subsequently, an amorphous type of frit glass was formed as a bonding material 124, on the region scheduled to be bonded of the face plate 121. The frit glass was formed with a screen printing technique and the solvent was dried in an atmosphere baking furnace (FIG. 14H).

Next, the frame member 130 having the second electrode 132 thereon which was formed in FIG. 14E was bonded to the face plate 121 which was formed in FIG. 14H. Specifically, the frame member 130 was aligned so that the opposite face to the second electrode 132 of the frame member 130 could come in contact with the bonding material 124. After that, the face plate 121 and the frame member 130 were hermetically bonded by overall heating of the frit glass 124, by baking the assembly structure of the face plate 121 and the frame member 130 in an atmosphere baking furnace (FIG. 14I). The bonding treatment temperature for the frit glass was 460° C.

Next, the frame member 130 (second substrate) was bonded to the rear plate 110. Specifically, an assembly structure was formed by bringing the rear plate 110 which was formed in FIG. 14C into contact with the face plate 121 which was formed in FIG. 14I. At this time, the bonding material 113 on the first substrate 110 was brought in contact with the second electrode 132 on the frame member 130 so that the regions scheduled to be bonded abutted on each other. The rear plate 110 was aligned with the face plate 121 so that the pixel patterns of the region 115 having electron-emitting devices formed thereon and the phosphor formation region 123 opposed to each other. (FIG. 14J)

Next, a voltage source 140 having a multichannel output was connected to the assembly structure which was formed in FIG. 14J (FIG. 14K). Two poles were output from the voltage source 140. The first pole was connected to the first electrode 116 and the second pole was connected to every segment of the second electrode 132 through a prober 141. The first electrode 116 was connected to an electrical bundle of the matrix wiring 111 and the electrodes 129 which had been separately provided in the four corners of the rear plate 110 so as to be capable of simultaneously applying a common potential to the bundle. The common potential was set at the GND potential.

Next, a laser light generating apparatus 150 was set up so as to form an optical arrangement in which the apparatus could irradiate the region scheduled to be bonded of the assembly structure that was formed in FIG. 14K, with a laser light. The laser light generating apparatus 150 can be moved above the assembly structure by a laser head moving apparatus 151 while irradiating the assembly structure with the laser. The semiconductor laser with a wavelength of 808 nm was used for the laser light source. The beam profile of the irradiating light was shaped by combining a beam splitter with a convergent lens so that the centers of the gravities and the directions of the long axes of a beam for auxiliary heating and a beam for processing overlapped one another. The focal position was determined so that this shaped beam spot could converge at the position of the bonding material 113. The beam for auxiliary heating was set so as to have a minor axis of 5 mm and a major axis of 10 mm, and the beam for processing was set to have a minor axis of 1 mm and a major axis of 2 mm.

When the laser light scanned the bonding material, the pattern of the voltage to be applied from the voltage source 140 to every segment of the second electrode 132 was varied according to the position of the laser head, as illustrated in FIG. 6. The potential of the first electrode 116 was set at the GND potential, in other words, 0 V, and the electrode potentials to be applied to every segment of the second electrode 132 were set at 50 V as the minimum potential and 220 V as the maximum potential. The hermetic seal bonding operation was completed by moving the position of application of the maximum voltage in the second electrode 132 while synchronizing the movement with the scan of the laser light, and by irradiating the whole region scheduled to be hermetically bonded with the laser light (FIG. 14L).

After that, the voltage source 140 was electrically disconnected from the prober 141, further the optical setting of the laser light generating apparatus 150 and laser head moving apparatus 151 was disengaged, and the completed hermetically sealed container was taken out (FIG. 14M). In the above way, the hermetically sealed container that included the rear plate 110, the frame member 130 and the face plate 121, and of which the four peripheries were sealed by continuous hermetic bonding, was manufactured based on the first embodiment.

Next, an exhaust pipe made from glass was connected to the exhaust hole of the hermetically sealed container, the hermetically sealed container was connected to an external exhaust apparatus formed of a scroll pump and a turbo-molecular pump through the exhaust pipe, and the inside of the hermetically sealed container was exhausted. At the same time when the external exhaust apparatus was operated, the exhaust pipe and the hermetically bonded container were baked at 350° C. for 1 hour. Thereby, the non-evaporative getter Ti (NEG-Ti) which was formed on the rear plate 110 was activated. When the temperature of the hermetically sealed container decreased to 300° C., the exhaust hole was chipped off, and the hermetically sealed container was completely sealed. Thereby, the hermetically sealed container having the inside evacuated was prepared.

When applying a pressing force to the region scheduled to be bonded with an electrostatic force, the voltage to be applied was controlled according to the method illustrated in FIGS. 10A to 10C. Specifically, the voltage to be applied was controlled by detecting the change of an electric current while the voltage increased to the maximum voltage Vmax and detecting the change of an electric current while the maximum voltage Vmax was applied. The insulation layer 112 is provided between the first electrode 116 and the second electrode 132 and a short circuit resists being generated, but when the bonding material 113 is rapidly crushed, the function of preventing the short circuit by the insulation layer 112 may not be necessarily sufficient. For this reason, it is effective to decrease a potential of the second electrode 132, based on an abnormal rise of the detected electric current in a period while the maximum voltage is applied.

When the manufactured hermetically sealed vacuum container was used as a field-emission display (FED), it was confirmed that the vacuum container could be stably driven for a long period of time. It was confirmed that the manufactured hermetically sealed container had high hermeticity and could maintain a high vacuum sufficiently applicable to an FED.

Exemplary Embodiment 2

In Exemplary Embodiment 1, the frit glass of the dielectrics was used as the bonding material, and the rear plate 110 was bonded to the frame member 130, but in the present exemplary embodiment, the electroconductive bonding material 114 formed from an AlSi alloy was used, as is illustrated in FIG. 11A.

In the present exemplary embodiment, a region to have the second electrode 132 formed therein was limited compared to Exemplary Embodiment 1 (FIG. 14E). When the rear plate 110 was aligned with the frame member 130, the bonding material 114 which was formed on the first substrate 110 was set so as to directly abut on the region on the frame member 130, in which the second electrode 132 was not formed. As a result, a region in which the electrostatic force between the first electrode 116 and the second electrode 132 is generated, and a region in which the first substrate 110 is scheduled to be bonded to the frame member 130 (region to be irradiated with laser light) formed a positional relationship of being mutually offset. The bonding material 114 was film-formed with a sputtering method so that the composition ratio of the AlSi alloy could be 87.8 atm % Al and 12.2 atm % Si, and the bondable treatment temperature of the AlSi alloy was 580° C.

Except the above, the hermetically sealed container was prepared in a similar way to Exemplary Embodiment 1. When the hermetically sealed vacuum container was prepared by evacuating the inside similarly to Exemplary Embodiment 1, and was applied to a field-emission display (FED), it was confirmed that the vacuum container could be stably driven for a long period of time. It was confirmed that the manufactured hermetically sealed container had high hermeticity and could maintain high vacuum sufficiently applicable to an FED.

Exemplary Embodiment 3

In the present exemplary embodiment, a hermetically sealed container was prepared by applying the manufacturing method according to the second embodiment illustrated in FIGS. 16A to 16J. The manufacturing method of the hermetically sealed container according to the present exemplary embodiment will be described in detail with reference to FIGS. 16A to 16J.

Firstly, preparation steps of the face plate 121 will be described below. A substrate PD200 made by ASAHI GLASS CO., LTD. (with plane size of 1,000 mm×600 mm and thickness of 1.8 mm) was prepared (FIG. 16A). Subsequently, the face plate 121 was subjected to cleaning by an organic solvent, rinsing by pure water and cleaning by UV-ozone, and the surface thereof was degreased. Subsequently, an anode formed from an electroconductive material and a phosphor formation region 123 formed of a phosphor pattern were formed on the central part of the tin-free face side of the face plate 121. Furthermore, the second electrode 127 which was formed of a segmented Al thin film was film-formed on the region scheduled to be bonded in four peripheries of the face plate 121, with a sputtering method by using a metal mask. Furthermore, an $SiO_2$ thin film was formed on the region scheduled to be bonded so as to have a film thickness of 0.5 μm with a plasma CVD method, and an insulation layer 112 was formed thereon. (FIG. 16B)

Next, an amorphous type of frit glass was formed as the bonding material 113, in the region scheduled to be bonded of the face plate 121. The frit glass was formed with a screen printing technique and the solvent was dried in an atmosphere baking furnace (FIG. 16C).

Next, the frame member 130 was formed which was one part of the second substrate. Firstly, the substrate PD200 made by ASAHI GLASS CO., LTD. with the thickness of 1.5 mm was prepared, and was cut out into the size with the outer shape of 980 mm×580 mm×the thickness of 1.5 mm. Subsequently, the region with the size of 970 mm×560 mm×the thickness of 1.5 mm in the central part of the substrate was cut out through a cutting work, and the frame member 130 having a squarish cross section with 5 mm width and 1.5 mm thickness was formed. Subsequently, the frame member 130 was subjected to cleaning by an organic solvent, rinsing by pure water and cleaning by UV-ozone, and the frame member 130 having a degreased surface was formed (FIG. 16D).

Next, an ITO thin film was formed on the frame member 130 as the first electrode 119 (FIG. 16E). The first electrode 119 was formed similarly to the first exemplary embodiment with the method illustrated in FIGS. 19A to 19E. By forming the first electrode 119 in the region on the side of the frame member 130, which was continuous to the region scheduled to be bonded of the frame member 130, a region to which an electrostatic force is applied and a region for electrical connection were secured.

Next, the assembly structure (second substrate) was formed which included the frame member 130 provided with the first electrode 119, which was formed in FIG. 16E, and the face plate 121 which was formed in FIG. 16C (FIG. 16F). At this time, the first electrode 119 of the frame member 130 was aligned so as to come in contact with the bonding material 113.

Next, the voltage source 140 having a multichannel output was connected to the assembly structure which was formed in FIG. 16F (FIG. 16G). Two poles were output from the voltage source 140. The first pole was connected to the first electrode 119 and the second pole was connected to every segment of the second electrode 127 through the prober 141. The common potential of the first electrode 119 was set at the GND potential.

Next, a laser light generating apparatus 150 was set up so as to form an optical arrangement in which the apparatus could irradiate the region scheduled to be bonded of the assembly structure that was formed in the FIG. 16G, with a laser light, and sequentially bonded the region scheduled to be hermetically bonded. The laser light generating apparatus 150 can be moved above the assembly structure by a laser head moving apparatus 151 while irradiating the assembly structure with the laser. The semiconductor laser with a wavelength of 808 nm was used for the laser light source. The beam profile of the irradiating light was shaped by combining a beam splitter with a convergent lens so that the centers of the gravities and the directions of the long axes of a beam for auxiliary heating and a beam for processing overlapped one another. The focal position was determined so that this shaped beam spot could converge at the position of the bonding material 113. The beam for auxiliary heating was set so as to have a minor axis of 5 mm and a major axis of 10 mm, and the beam for processing was set to have a minor axis of 1 mm and a major axis of 2 mm.

When the laser light scanned the bonding material, the pattern of the voltage to be applied from the voltage source 140 to every segment of the second electrode 127 was varied according to the position of the laser head, as illustrated in FIG. 6. The potential of the first electrode 119 was set at the GND potential, in other words, 0 V, and the electrode potentials to be applied to every segment of the second electrode 127 were set at 50 V as the minimum potential and 220 V as the maximum potential. The hermetic seal bonding operation was completed by moving the position of application of the maximum voltage in the second electrode 127 while synchronizing the movement with the scan of the laser light, and by irradiating the whole region scheduled to be hermetically bonded with the laser light (FIG. 16H).

The laser light scanned the whole region scheduled to be hermetically bonded while the irradiation position of the laser light and the position of application of the maximum voltage of the second electrode 127 were moved in this way, and the hermetic seal bonding operation was completed.

After that, the voltage source 140 was electrically disconnected from the prober 141, and further the optical setting of the laser light generating apparatus 150 and laser head moving apparatus 151 was disengaged (FIG. 16I). Then, the face plate 121 formed in the similar way to the Exemplary Embodiment 1 and the frame member 130 were bonded (FIG. 16J). In the above way, the hermetically sealed container that included the rear plate 110, the frame member 130 and the face plate 121, and of which the four peripheries were sealed by continuous hermetic bonding, was manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-188430, filed Aug. 25, 2010, which is hereby incorporated by reference herein in its entirety.

What is claimed is:

1. A manufacturing method of a hermetic container having first and second dielectric substrates comprising:
   a step of providing a first electrode operating also as a bonding material on one of the first and second substrates, while providing a second electrode divided into a plurality of segments for simultaneously applying thereto potentials different from each other on the other of the first and second substrates;
   a step of arranging the first and second substrates, so that the first and second electrodes are opposed to each other; and
   a first bonding step of heating the first electrode while pressing the first and second substrates to each other to bond the first and second substrates together, wherein the first bonding step includes steps of:
   pressing the first and second substrates to each other by an electrostatic force generated between the first and second electrodes by applying a potential difference between the first and second electrodes;
   softening and melting the first electrode, and then cooling and solidifying the first electrode, by simultaneously forming a locally-heated spot in the bonding material and moving the locally-heated spot relatively against the bonding material; and
   increasing the potential difference between the first electrode and the segment of the second electrode at which the locally-heated spot is positioned correspondingly to the moving of the locally-heated spot.

2. The method according to claim 1, wherein the first electrode is formed in a continuous and closed annular shape.

3. The method according to claim 1, wherein, the bonding material is a frit glass.

4. The method according to claim 1, wherein the bonding material contains metal including any one or more of Al, Al—Si compound, Sn and In.

5. The method according to claim 1, wherein the heating unit is a laser light generating apparatus for emitting a laser light, the first or second electrode is a translucent electrode, and the laser light is irradiated through the translucent electrode to the bonding material.

6. The method according to claim 1, wherein the potential difference between the first electrode and the segment of the second electrode which is heated by the heating unit is decreased after cooling and solidifying the bonding material.

7. The method according to claim 1, wherein, during the first bonding step, the potential difference between the first electrode and the segment of the second electrode which is heated by the heating unit is increased into a maximum value, and is maintained at the maximum value for a predetermined period,
during increasing the potential difference into the maximum value, a current charging a capacitor formed by the first and second electrodes is detected, and, in response to a detection of increasing the current, the maximum potential difference is set to be decreased, while, in response to a detection of decreasing the current, the maximum potential difference is set to be increased.

8. The method according to claim 1, wherein, during the first bonding step, the potential difference between the first electrode and the segment of the second electrode which is heated by the heating unit is increased into a maximum value, is maintained at the maximum value, and is decreased thereafter,
when the potential difference is at the maximum value, the current charging the capacitor formed by the first and second electrodes is detected, and, in response to a detection of increasing the current, the potential difference is decreased.

9. The method according to claim 1, wherein the second substrate is a frame member, or an integrated member provided with a frame member arranged at a periphery of a flat substrate.

10. The method according to claim 9, further comprising a second bonding step for bonding the frame member at the periphery of the flat substrate, to form the integrated member of the flat substrate and the frame member.

11. The method according to claim 10, wherein the first substrate and the frame member are formed from alkali-free glass, or high strain point glass.

12. A manufacturing method of a hermetic container having first and second dielectric substrates comprising:
    a step of providing a first electrode and a second electrode operating also as a bonding material and divided into a plurality of segments for simultaneously applying thereto potentials different from each other on the other of the first and second substrates, to form a gap between the first and second electrodes, on one of the first and second substrates, while providing;
    a step of arranging the first and second substrates, so that the first and second electrodes are opposed to the second substrate; and
    a first bonding step of heating the first electrode while pressing the first and second substrates to each other to bond the first and second substrates together, wherein the first bonding step includes steps of:
    pressing the first and second substrates to each other by an electrostatic force generated between the first and second electrodes by applying a potential difference between the first and second electrodes;
    softening and melting the first electrode, and then cooling and solidifying the first electrode, by simultaneously forming a locally-heated spot in the bonding material and moving the locally-heated spot relatively against the bonding material; and
    increasing the potential difference between the first electrode and the segment of the second electrode at which the locally-heated spot is positioned correspondingly to the moving of the locally-heated spot.

13. The method according to claim 12, wherein, between the first and second electrodes, an alternating wave transitioning between positive and negative potentials is provided.

14. The method according to claim 12, wherein the first electrode is formed in a continuous and closed annular shape.

15. The method according to claim 12, wherein the bonding material is a frit glass.

16. The method according to claim 12, wherein the bonding material contains metal including any one or more of Al, Al—Si compound, Sn and In.

17. The method according to claim 12, wherein
the second substrate is a frame member, or an integrated member provided with a frame member arranged at a periphery of a flat substrate.
18. The method according to claim 12, wherein
the heating unit is a laser light generating apparatus for emitting a laser light,
the first or second electrode is a translucent electrode, and
the laser light is irradiated through the translucent electrode to the bonding material.
19. The method according to claim 12, wherein
the potential difference between the first electrode and the segment of the second electrode which is heated by the heating unit is decreased after cooling and solidifying the bonding material.
20. The method according to claim 12, wherein
the first and second electrodes are placed on the same plane, and the second electrode is placed outside of the first electrode.
21. The method according to claim 20, wherein
the first electrode has bridges each grounded and extending between segments of the second electrode.

\* \* \* \* \*